(12) United States Patent
Kimura

(10) Patent No.: US 7,646,143 B2
(45) Date of Patent: Jan. 12, 2010

(54) SELF-LIGHT EMITTING DEVICE AND ELECTRICAL APPLIANCE USING THE SAME

(75) Inventor: Hajime Kimura, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 805 days.

(21) Appl. No.: 09/837,105

(22) Filed: Apr. 18, 2001

(65) Prior Publication Data

US 2001/0035713 A1 Nov. 1, 2001

(30) Foreign Application Priority Data

Apr. 21, 2000 (JP) .............. 2000-121854

(51) Int. Cl.
*H01J 1/62* (2006.01)
*H01J 63/04* (2006.01)
*H01K 1/26* (2006.01)

(52) U.S. Cl. .............. 313/501; 313/483; 313/498; 313/500; 313/504; 313/505; 313/110; 313/112

(58) Field of Classification Search .............. 313/501, 313/503, 504, 506, 509; 257/59, 72, 347, 257/348, 349; 345/77
See application file for complete search history.

(56) References Cited

U.S. PATENT DOCUMENTS

| | | | | |
|---|---|---|---|---|
| 5,206,746 A * | 4/1993 | Ooi et al. ............ | 349/62 |
| 5,396,350 A | 3/1995 | Beeson et al. .......... | 359/40 |
| 5,555,109 A | 9/1996 | Zimmerman et al. ...... | 359/40 |
| 5,598,281 A | 1/1997 | Zimmerman et al. ..... | 349/5 |
| 5,608,286 A * | 3/1997 | Levine et al. .......... | 313/495 |
| 5,637,958 A * | 6/1997 | Levine .................. | 313/496 |
| 5,684,365 A * | 11/1997 | Tang et al. ............ | 315/169.3 |
| 5,771,328 A * | 6/1998 | Wortman et al. ........ | 385/146 |
| 5,781,255 A * | 7/1998 | Yamamoto et al. ...... | 349/46 |
| 5,814,416 A | 9/1998 | Dodabalapur et al. | |
| 5,920,080 A * | 7/1999 | Jones .................. | 257/40 |
| 5,932,892 A * | 8/1999 | Hseuh et al. .......... | 257/59 |
| 5,944,405 A | 8/1999 | Takeuchi et al. ........ | 362/31 |
| 5,990,629 A * | 11/1999 | Yamada et al. ......... | 315/169.3 |

(Continued)

FOREIGN PATENT DOCUMENTS

EP 0 787 271 B1 8/1997

(Continued)

OTHER PUBLICATIONS

U.S. Appl. No. 09/631,067 (pending) to Kimura, including specification, claims, abstract, drawings and PTO filing receipt.

(Continued)

*Primary Examiner*—Nimeshkumar D. Patel
*Assistant Examiner*—Natalie K Walford
(74) *Attorney, Agent, or Firm*—Cook Alex Ltd.

(57) ABSTRACT

A self-light emitting device and an electrical appliance including the same are provided, in which extracting efficiency of light from a light emitting element, especially in an EL element, can be improved. A light scattering body formed by etching a transparent film is provided on an insulator so that the extracting efficiency of light can be improved, and the self-light emitting device with high efficiency of light emission can be provided.

20 Claims, 16 Drawing Sheets

U.S. PATENT DOCUMENTS

| | | | |
|---|---|---|---|
| 6,011,529 A * | 1/2000 | Ikeda | 345/77 |
| 6,052,164 A * | 4/2000 | Cobb et al. | 349/64 |
| 6,091,384 A * | 7/2000 | Kubota et al. | 345/76 |
| 6,104,041 A * | 8/2000 | Hsueh et al. | 257/59 |
| 6,129,439 A | 10/2000 | Hou et al. | 362/31 |
| 6,147,451 A * | 11/2000 | Shibata et al. | 313/506 |
| 6,246,179 B1 * | 6/2001 | Yamada | 315/169.3 |
| 6,320,633 B1 | 11/2001 | Broer et al. | 349/113 |
| 6,476,550 B1 * | 11/2002 | Oda et al. | 313/504 |
| 6,508,564 B1 * | 1/2003 | Kuwabara et al. | 362/31 |
| 6,607,277 B2 | 8/2003 | Yokoyama et al. | |
| 6,617,784 B1 * | 9/2003 | Abe et al. | 313/506 |
| 6,677,703 B2 * | 1/2004 | Ito et al. | 313/478 |
| 6,703,780 B2 * | 3/2004 | Shiang et al. | 313/504 |
| 6,777,871 B2 * | 8/2004 | Duggal et al. | 313/506 |
| 6,805,448 B2 | 10/2004 | Yokoyama et al. | |
| 2001/0013924 A1 | 8/2001 | Yokoyama et al. | |
| 2004/0027545 A1 | 2/2004 | Yokoyama et al. | |

FOREIGN PATENT DOCUMENTS

| | | |
|---|---|---|
| EP | 0 987 925 A1 | 3/2000 |
| EP | 0 787 271 | 6/2001 |
| EP | 0 801 429 B1 | 9/2003 |
| EP | 0 869 388 B1 | 1/2004 |
| EP | 1 388 767 B1 | 4/2006 |
| JP | 2001-51272 | 2/2001 |
| JP | 2001- 051272 | 2/2001 |
| KR | 1999-0071622 | 9/1999 |
| KR | 2000-0020971 | 4/2000 |
| KR | 10-0255899 | 5/2000 |
| TW | 278142 A | 6/1996 |
| TW | 289802 A | 11/1996 |
| WO | WO 96/11358 | 4/1996 |

OTHER PUBLICATIONS

English Abstract re Japanese Patent Application No. JP 2001-051272 published Feb. 23, 2001.

Tanaka et al, "Front Light Techniques which Expand a Range of Applications of Reflective Color Liquid Crystals," Liquid Crystal Display Seminar '98,Material Technology, text E-6 (4),pp. 1-9, (1998).

Funamoto, T. et al, "A Front-Lighting System Utilizing a Thin Light Guide," Asia Display 98, pp. 897-900 (1998).

Yamashita, "Reflective Color LCD Panels Appear at EDEX 98—Toward Full Scale Popularization," Nikkei Electronics, No. 717, pp. 41-46, Jun. 1, 1998.

Sato, "Sony has Represented its Reflective Low-Temperature Poly-Si TFT-LCD," Monthly FPD Intelligence, pp. 22-23, Sep. 1998.

Cornelissen, H.J. et al., "Frontlights for Reflective LCDs based on Lightguides with Micro-Grooves,"SID 99 Digest, pp. 912-915, (1999).

Tsutsui, T., et al, "Electroluminescence in Organic Thin Films," Photochemical Processes in Organized Molecular Systems, pp. 437-450, 1991.

Baldo, M.A. et al, "Highly Efficient Phosphorescent Emission from Organic Electroluminescent Devices," Nature, vol. 395, pp. 151-154, Sep. 10, 1998.

Baldo, M.A. et al, "Very High-Efficiency Green Organic Light-Emitting Devices Based on Electrophosphorescence," Applied Physics Letters, vol. 79, No. 1, pp. 4-6, Jul. 5, 1999.

Tsutsui, T. et al, "High Quantum Efficiency in Organic Light-Emitting Devices with Iridium-Complex as a Triplet Emissive Center," Japanese Journal of Applied Physics, vol. 38, part 2, No. 12B, pp. L 1502-L 1504, Dec. 15, 1999.

Abstract re Japanese Patent Application No. JP 2001-51272, published Feb. 23, 2001.

\* cited by examiner

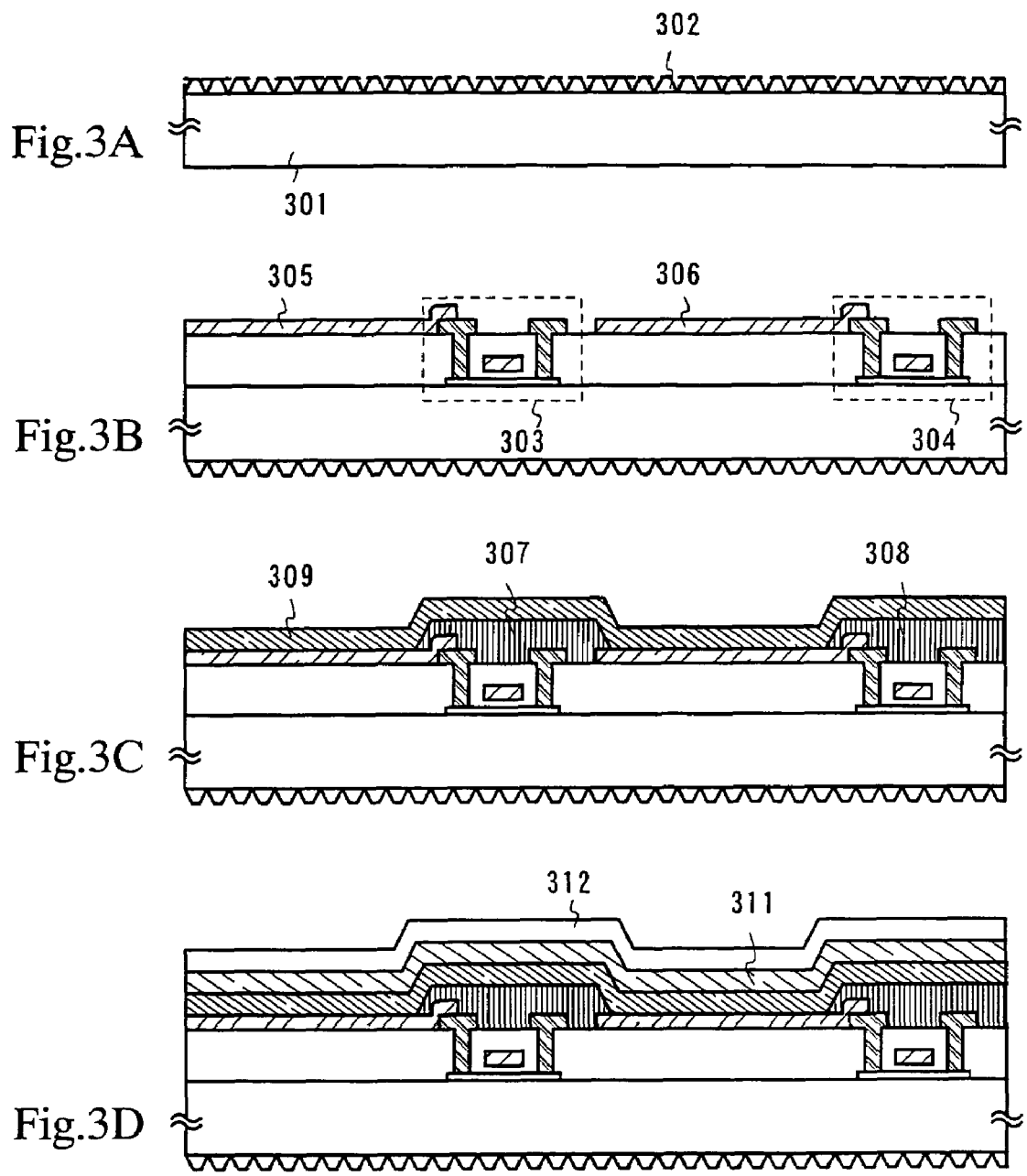

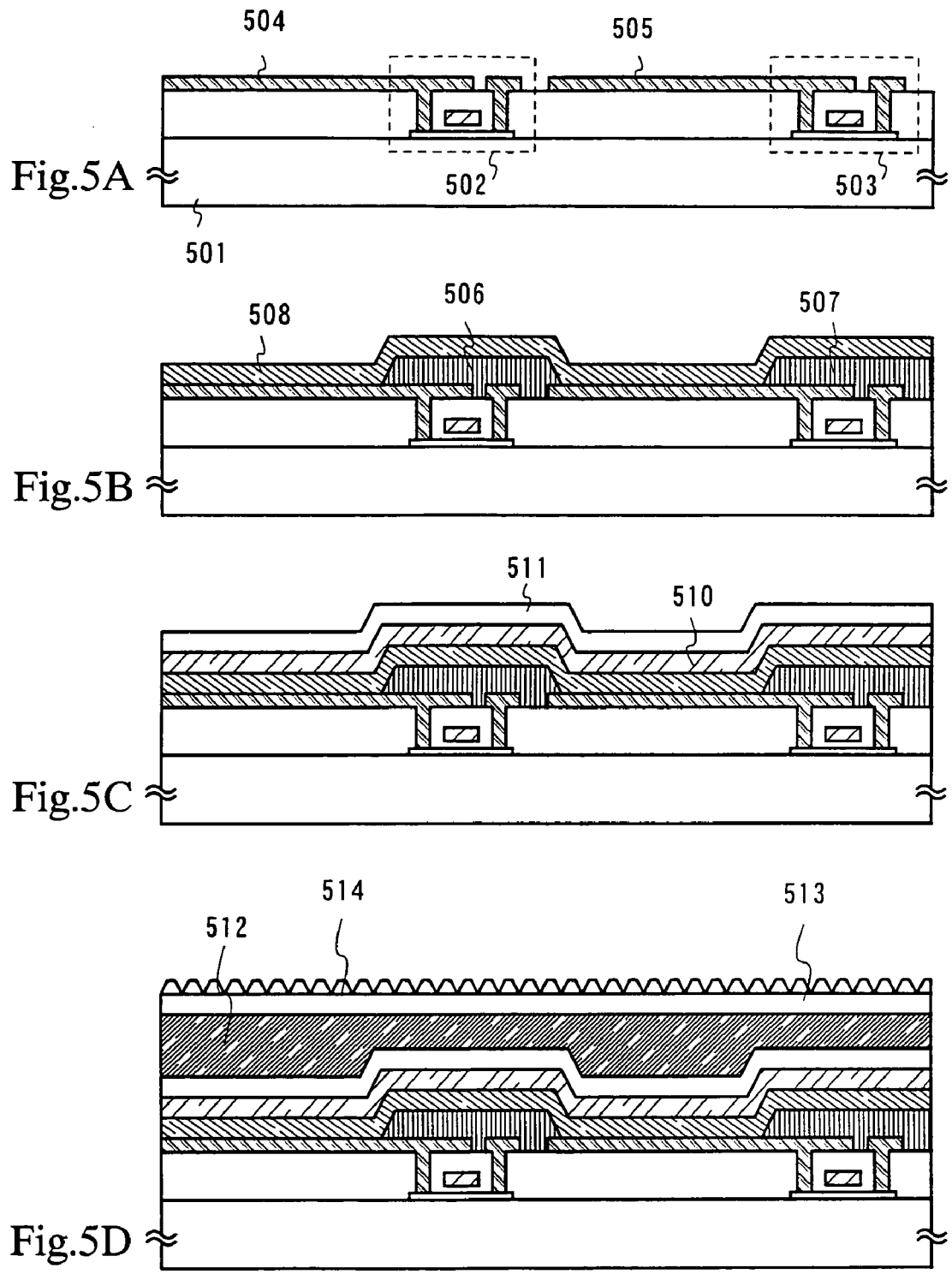

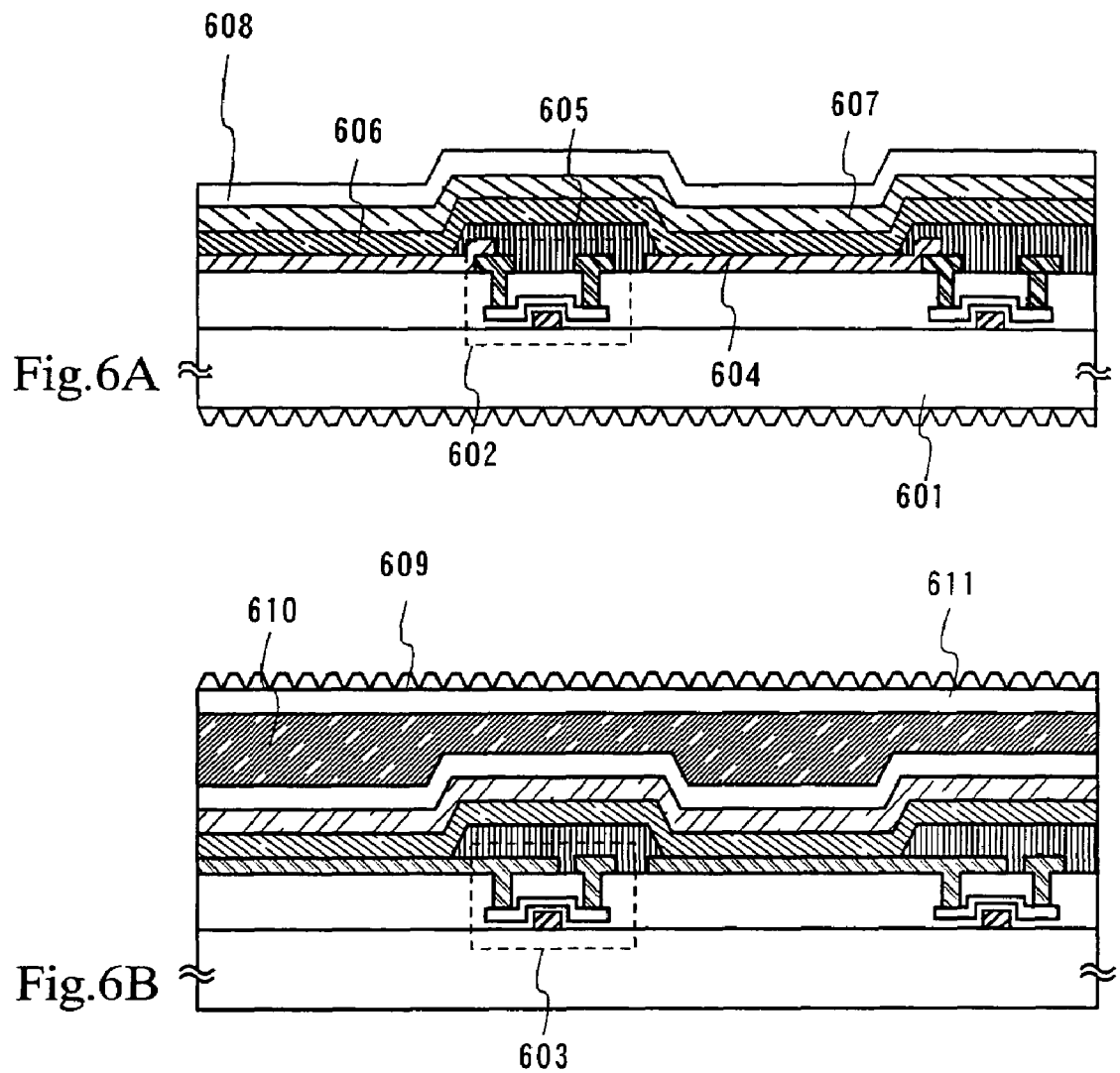

US 7,646,143 B2

SELF-LIGHT EMITTING DEVICE AND ELECTRICAL APPLIANCE USING THE SAME

BACKGROUND OF THE INVENTION

1. Field of the Invention

The present invention relates to an elemental device structure for improving extracting efficiency of light produced in the inside of an EL (electro luminescence) element when planar light emission is extracted by supplying current to the EL element. A self-light emitting device according to the present invention includes an organic EL display and an OLED (Organic Light Emitting Diode).

2. Description of the Related Art

Although light emitted from a self-light emitting device is extracted as planar light emission into the air, a lot of light can not be extracted from the inside of the substrate since a substrate positioned at an interface between the self-light emitting device and the air has a flat plate shape, and its extracting efficiency is 20 to 50%.

SUMMARY OF THE INVENTION

The present invention has been made to solve the above problem, and an object of the invention is therefore to improve extracting efficiency of light produced in a light emitting element, especially in an EL element, by forming an uneven light scattering body on the opposite surface of a substrate. Further, the light scattering body is formed by etching a transparent film on the substrate, and minute processing of pitches becomes possible. Another object of the present invention is to provide a self-light emitting device with higher efficiency of light emission by forming a light scattering body of a minute pitch.

BRIEF DESCRIPTION OF THE DRAWINGS

FIGS. 3A to 3D are views in which the present invention is used for an active matrix type TFT.

FIGS. 5A to 5D are views in which the present invention is used for an active matrix type TFT.

FIGS. 6A and 6B are views in which the present invention is used for a reverse stagger active matrix type TFT.

DETAILED DESCRIPTION OF THE PREFERRED EMBODIMENTS

A configuration used for improving extracting efficiency of light in the present invention will be described with reference to FIGS. 1A to 1C.

Figure 1A:
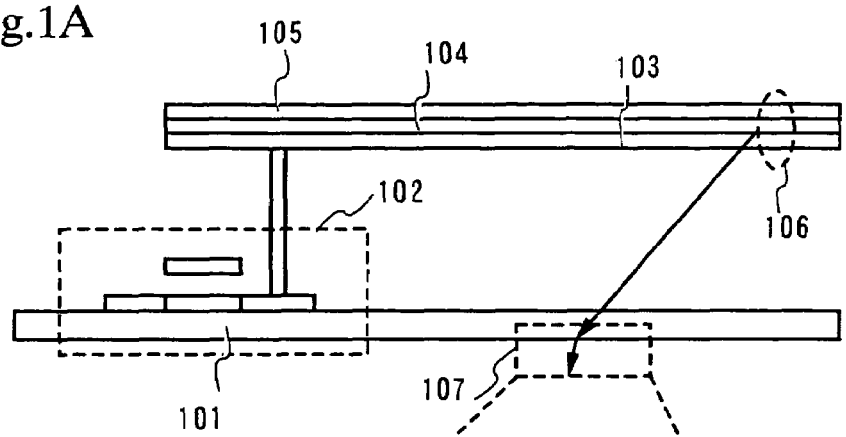
FIGS. 1A to 1C are views showing a structure of a light scattering body of the present invention.

FIG. 1A shows an example of a case in which the present invention is used for an active matrix type self-light emitting device. Reference numeral 101 designates a substrate made of an insulator, and a current controlling TFT 102 is formed on the substrate 101. A drain region of the current controlling TFT 102 is electrically connected to a pixel electrode 103. (The pixel electrode 103 can also be connected to a source region.) Here, the pixel electrode 103 is an anode, and the pixel electrode 103 is formed of a transparent conductive film so that light is emitted from the side of the pixel electrode 103 of an EL element 106.

Further, an EL layer 104 is formed on the pixel electrode 103, and a cathode 105 is formed on the EL layer 104. Accordingly, the EL element 106 constituted of the pixel electrode 103, the EL layer 104, and the cathode 105 is formed.

In the self-light emitting device with the foregoing configuration, unevenness is formed on a rear surface of the substrate 101, that is, a surface at the side where the TFT is not formed. A part of a light scattering body 108 is designated by 107, and the enlarged view of the part 107 is shown.

With forming the light scattering body 108, it is possible to prevent an incident angle from the light scattering body 108 to the air 109 from exceeding the critical angle, and it is possible to prevent light from being totally reflected and being confined in the light scattering body. Thus, the extracting efficiency of light from the EL element 106 can be improved. The light scattering body is formed by etching a transparent film made of a transparent material. In the present specification, the transparent film is a film being transparent to visible light.

Figure 1B:
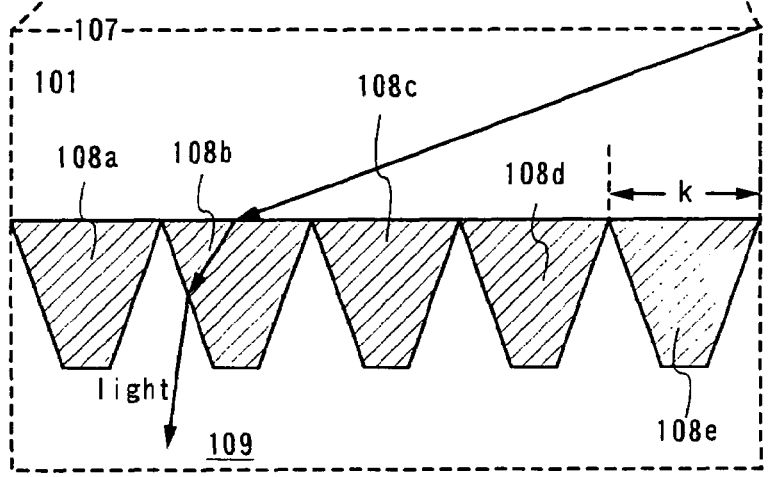

The enlarged view of the part 107 shown in FIG. 1B shows a state where light which has passed through the substrate 101 passes through the light scattering body 108 and is emitted into the air 109.

Light scattering bodies 108a, 108b, 108c, 108d and 108e shown in FIG. 1B are respectively formed to be dot-shaped, and these are called the light scattering body 108 in the present specification.

Figure 1C:
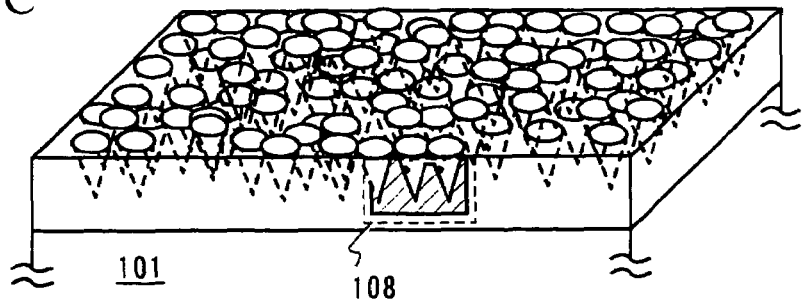

FIG. 1C is a perspective view of a surface on which the light scattering body 108 is formed.

In the present invention, light emitted from the EL element 106 enters the substrate 101, and then enters the light scattering body 108.

Figure 2:
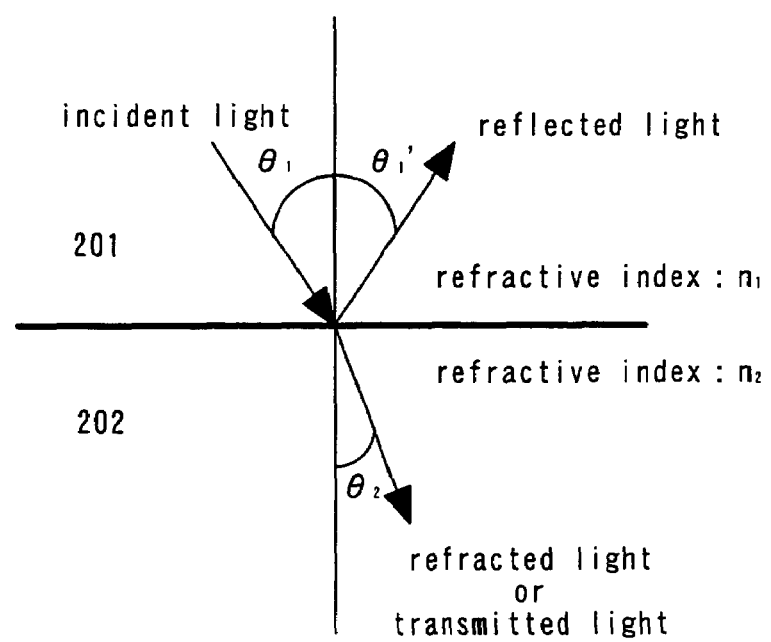
FIG. 2 is an explanatory view of refraction of light.

Incidentally, as shown in FIG. 2, refraction of light is determined by an angle (incident angle) of incident light and a refractive index of a medium. Further, and follows a following expression (Snell's law).

That is, in a medium 1 (201) with a refractive index $n_1$, when light (incident light) enters at an angle $\theta_1$ into a medium 2 (202) with a refractive index $n_2$, it becomes light (refracted light) of an angle $\theta_2$ satisfying the following expression $$n_1 \sin\theta_1 = n_2 \sin\theta_2 \qquad \text{[Expression 1]}$$

Incidentally, an incident angle $\theta_1$ when an angle $\theta_2$ of refracted light becomes 90 is referred to as a critical angle.

When the incident angle $\theta_1$ to the medium 2 becomes larger than the critical angle, light is totally reflected. That is, light is confined in the medium 1.

Further, expressions (Fresnell's law) shown below are established between reflectivity (R) and transmissivity (T) of energy.

$R=\frac{1}{2}\{\sin^2(\theta_1-\theta_2)/\sin^2(\theta_1+\theta_2)+\tan^2(\theta_1-\theta_2)/\tan^2(\theta_1+\theta_2)\}$ [Expression 2]

$T=1-R$ [Expression 3]

That is, if the refractive index of the substrate 101 is different from that of the light scattering body 108, a reflection component is generated. Thus, it is proper that the refractive index of the substrate 101 is the same as that of the light scattering body 108.

From the expressions 1 to 3, as shown in FIG. 1, when light goes out into the air 109 with a refractive index of 1 from the light scattering body 108 with a refractive index of 1.45 to 1.60, that is, when light goes out into a medium with a small refractive index from a medium with a large refractive index, the reflectivity becomes large. When the incident angle becomes larger than the critical angle, light is totally reflected. That is, it is appropriate that the configuration of the light scattering body 108 is made so that the incident angle becomes small.

From the above, in the present invention, the configuration of a light refraction layer is made uneven so that an incident angle to the air becomes small, and more light is scattered and becomes easy to extract into the air.

In the present invention, since irregular unevenness formed by etching become the light scattering body 108, there is a merit that it is not necessary to precisely unify the configuration and preparation is easy.

Although the present invention can be used for many self-light emitting devices, especially in an EL element using an EL material which remarkably is subject to an influence of use efficiency of light, since electric power consumed by the EL element can be reduced and the life thereof can be lengthened, the present invention is very effective.

Hereinafter, embodiments of the present invention will be described in detail.

Embodiment 1

In this embodiment, a description will be given about an example in which the present invention is used for an active matrix type self-light emitting device in which light is transmitted to the side of a pixel electrode. First, as shown FIG. 3A, a transparent film is formed on a rear surface of a substrate 301. As a transparent material for forming the transparent film, an organic resin such as polycarbonate, acryl resin, polyimide, polyamide or BCB (benzocyclobutene), indium oxide, tin oxide, or zinc oxide is used, or a compound film of a combination of the above material is used.

Figure 4A:
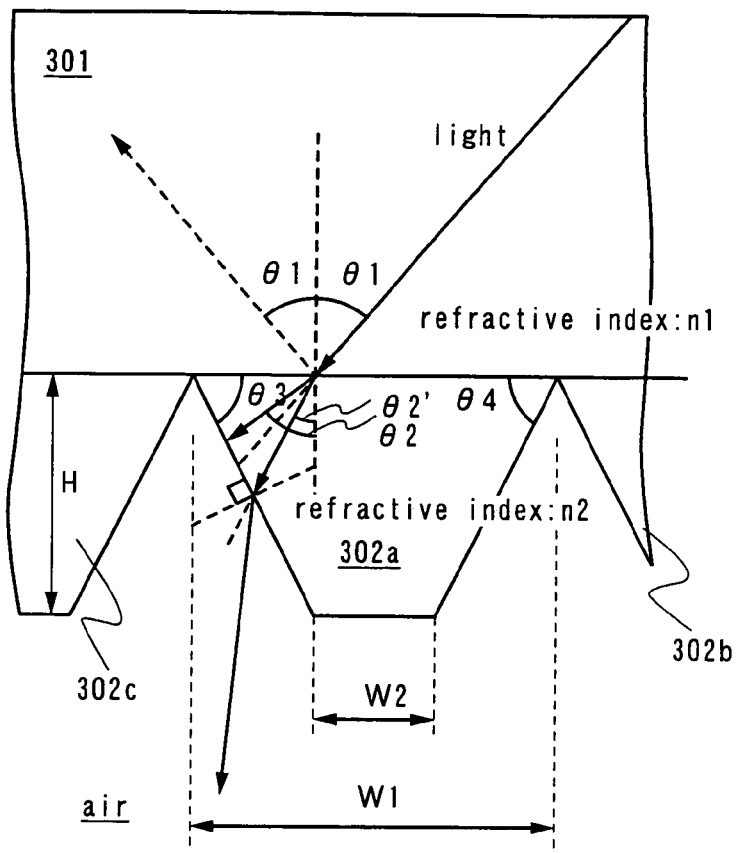
FIGS. 4A to 4G are views showing the details of light scattering bodies.

Next, this transparent film is etched, so that a light scattering body 302 as shown in FIG. 3A is formed. The light scattering body 302 formed at this time will be described with reference to FIG. 4A. FIG. 4A shows the light scattering body 302 formed into a trapezoid. Since symbols used here are the same as those used in FIG. 3A, correspondence may be made each time.

FIG. 4A shows an upside-down structure of FIG. 3A so that the light scattering body 302 formed on the rear surface of the substrate is positioned under the substrate. It is assumed that light emitted from an EL element at a TFT side seen from the substrate 301 enters the light scattering body 302 at an incident angle $\theta_1$ as shown in FIG. 4A. Here, when the refractive index of the substrate 301 is n1, and the refractive index of the light scattering body 302 is n2, the light enters the light scattering body 302 at an angle of $\theta_2$ if the relation of n1>n2 is established.

On the other hand, if the relation of n1<n2 is established, the light goes out into the light scattering body 302 at an angle of $\theta_2'$. That is, the relation of $\theta_2>\theta_2'$ is established, and the outgoing angle of light going out into a medium with a high refractive index from a medium with a low refractive index becomes small.

However, here, when the light is extracted from the light scattering body 302 into the air, the outgoing angle becomes large, the reflectivity also becomes high, and accordingly the outgoing becomes difficult since the light goes out into a medium with a low refractive index from a medium with a high refractive index. Then, as shown in FIG. 4A, angles $\theta_3$ and $\theta_4$ between the light scattering body 302a and the substrate of the insulator are restricted. The present invention provide such a configuration that the extracting efficiency of outgoing light in the normal direction to the substrate in which the extracting efficiency is highest is not dropped, and formation is made so that the angles $\theta_3$ and $\theta_4$ become 60 degrees or larger. However, $\theta_3$ and $\theta_4$ may not necessarily be formed to be the same angle.

Besides, in order to prevent an image from blurring, a pitch of the light scattering body 302a is made such that a length W1 of a contact portion to the substrate becomes a half of a pixel pitch or less. Besides, in order to extract light more easily, the shorter a length W2 of the trapezoid is, the better. Incidentally, it is most desirable that W2=0.

Further, in order to form the light scattering body so that the angles $\theta_3$ and $\theta_4$ of the light scattering body 302 become 60 degrees or larger, it is preferable that the thickness H of the transparent film is made to have a relation of H≧W1 with respect to the pitch (W1) of the light scattering body 302.

Besides, in the present invention, it is not necessary to form an accurate configuration by using a metal mold or the like or to smoothen the surface, but minute unevenness have only to be formed on the rear surface of the substrate at the side where light goes out.

In the manner as described above, the light scattering body 302 is formed on the rear surface of the substrate 301.

Figure 4B:
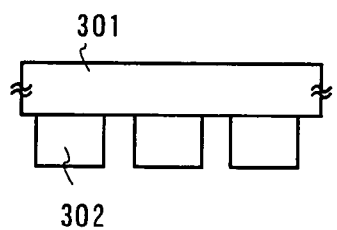
Figure 4E:
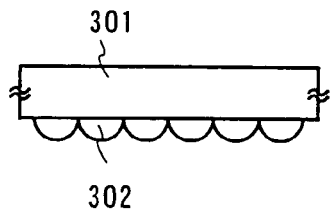
Figure 4C:
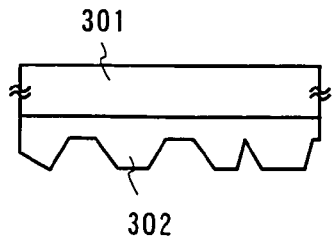
Figure 4F:
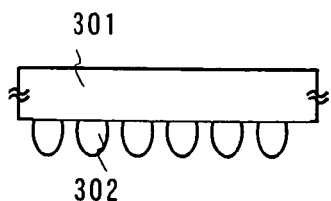
Figure 4D:
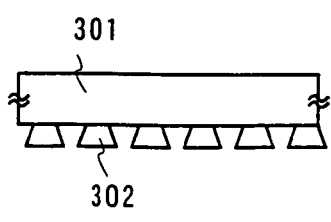
Figure 4G:
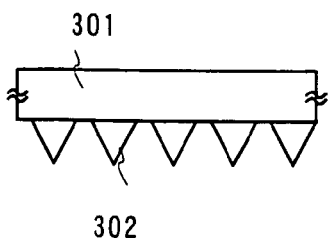

FIGS. 4B to 4G shows patterns which can be formed as the light scattering body 302. FIG. 4B shows an example in which square light scattering bodies are provided at intervals on the rear surface of the substrate. FIG. 4C shows an example in which light scattering bodies completely cover the substrate and there is no interval between the light scattering bodies. FIG. 4D shows an example in which reversed taper-shaped light scattering bodies are formed on the rear surface of the substrate, and FIG. 4E shows an example in which hemispheric light scattering bodies are formed on the rear surface of the substrate. FIG. 4F shows elliptical light scattering bodies, and FIG. 4G shows an example in which triangular scattering bodies in section are formed.

Incidentally, the light scattering bodies shown in FIGS. 4A to 4G may be provided so that intervals between the light scattering bodies are secured, or the light scattering bodies overlap with one another.

After the light scattering body 302 is formed on the rear surface of the substrate 301, p-channel TFTs 303 and 304 are formed by a well-known method on the surface of the substrate 301 on which an insulating film is formed. Although the planar TFT is exemplified in this embodiment, the TFT structure is not limited. That is, a reverse stagger type TFT may be used.

Next, pixel electrodes 305 and 306 electrically connected to the respective p-channel TFTs 303 and 304 are formed. As the pixel electrodes 305 and 306, a material with large work function is used since they function as anodes of EL elements. Thus, in this embodiment, as a translucent material (or transparent material) which is transparent to visible light, an oxide conductive film (a film made of indium oxide, tin oxide, or zinc oxide, or a compound film of a combination of these) is used. Gallium may be added to this oxide conductive film (FIG. 3B).

Next, banks 307 and 308 are formed of resin films so as to surround the pixel electrodes 305 and 306, and an EL layer 309 is formed thereon. In this embodiment, the banks 307 and 308 are formed of acryl films, and the EL layer 309 is formed by a spin coating method. As a material of the EL layer 309, polyfluorene of a high molecular organic material is used. Of course, chromaticity control may be made by adding a fluorescent material to polyfluorene (FIG. 3C).

Next, a cathode is formed using a light-shielding material. In this embodiment, as a cathode 311, an alloy film is formed to a thickness of 300 nm by evaporating both aluminum and lithium, and a silicon nitride film as a passivation film 312 is formed thereon by a sputtering method. It is also effective to laminate a carbon film, specifically a DLC (Diamond-Like Carbon) film thereon.

In the manner as described above, the self-light emitting device having the structure shown in FIG. 3D is completed. Thereafter, the EL element is sealed with resin or the EL element is sealed in an airtight space so that the EL element does not come in contact with the outer air.

Embodiment 2

In this embodiment, a description will be given of an example in which the present invention is applied to an active matrix type self-light emitting device which reflects light at a side of a pixel electrode. First, as shown FIG. 5A, n-channel TFTs 502 and 503 are formed by a well-known method on a substrate 501 with an insulating film on its surface. In this embodiment, although a planar type TFT is exemplified, a TFT structure is not limited. That is, a reverse stagger type TFT may be used.

At this time, in the respective n-channel TFTs 502 and 503, drain wiring lines are used as pixel electrodes 504 and 505. In the case of this embodiment, since it is necessary for the pixel electrodes 504 and 505 to reflect light, a metal film with high reflectivity is used for the pixel electrodes 504 and 505. At the same time, they also function as cathodes of EL elements, the metal film containing a material with small work function is used. In this embodiment, an alloy film containing aluminum and lithium is used (FIG. 5A).

Next, banks 506 and 507 are formed of resin films so as to surround the end portions of the pixel electrodes 504 and 505, and an EL layer 508 is formed thereon. In this embodiment, the banks 506 and 507 are formed of acryl films, and the EL layer 508 is formed by an evaporation method. As the material of the EL layer 508, Alq$_3$ (tris-8-quinolinolato aluminum complex) is used. Of course, chromaticity control may be made by adding a fluorescent material to Alq$_3$ (FIG. 5B).

Next, as an anode 510, an oxide conductive film in which gallium oxide is added to zinc oxide is formed to a thickness of 300 nm, and further, as a passivation film 511, a silicon nitride film is formed thereon by a sputtering method. It is also effective to laminate a carbon film, specifically a DLC (Diamond-Like Carbon) film thereon (FIG. 5C).

Next, as shown in FIG. 5D, a sealing film made of organic resin is formed. At this time, the sealing film is formed so that the EL element does not come in contact with the outer air.

Further, a sealing substrate 513 is provided on the sealing film 512. At this time, the sealing substrate 513 is provided so that the EL element does not come in contact with the outer air as well as the formation of the sealing.

Next, a transparent film is formed on the sealing substrate. As the transparent material for forming the transparent film, organic resin such as polycarbonate, acryl resin, polyimide, polyamide or BCB (benzocyclobutene); indium oxide, tin oxide, or zinc oxide is used to form a film, or a compound film of a combination of these is used. In order that angles θ3 and θ4 of the light scattering body 514 becomes 60 degrees or larger, it is preferable that the thickness (H) of the transparent film is made to have the relation of H≧W1 with respect to the pitch (W1) of the light scattering body. By etching the transparent film, the light scattering body 514 as shown in FIG. 5E is formed.

It is not always necessary to provide the sealing film formed of the organic resin film as shown in this embodiment, and the EL element may be sealed in an airtight space. Incidentally, since it becomes hard for light to be extracted when it goes out into a medium with a low refractive index from a medium with a high refractive index, in this case, it is appropriate that the light scattering body 514 is provided on an interface between the passivation film 511 and the airtight space, that is, on the passivation film 511.

In the thus obtained self-light emitting device, since the light scattering body is provided on the surface where light goes out as compared with a normal sealing structure, high extracting efficiency of light can be obtained as compared with a conventional self-light emitting device. By this, since voltage for driving the EL element can be made low, the life of the EL element can be lengthened.

Incidentally, the structure of this embodiment can be put into practice by combination with any structure of the embodiment 1.

Embodiment 3

In the embodiment 1 and the embodiment 2, although the examples in which the present invention is applied to the planar type TFT have been described, in this embodiment, a structure in which the present invention is used for a reverse stagger type TFT is shown in FIGS. 6A and 6B.

FIG. 6A shows a structure of an active matrix type self-light emitting device in which light is transmitted to the side of a pixel electrode, and FIG. 6B shows a structure of an active matrix type self-light emitting device in which light is reflected at the side of a pixel electrode.

In FIGS. 6A and 6B, reference numeral 601 designates a substrate; 602, a p-channel TFT used in FIG. 6A; and 603, an n-channel TFT used in FIG. 6B. In either case, a gate electrode is formed on the substrate 601, and a source region, a drain region and a channel formation region are formed on the gate electrode through a gate insulating film. Reference numeral 604 designates a pixel electrode; and 605, a bank partitioning the pixel electrode. An EL layer 606 is formed on the pixel electrode 604, and a cathode 607 and a passivation film 608 are formed on the EL layer 606.

Incidentally, since FIG. 6A shows the structure in which light is transmitted to the side of the pixel electrode, a light scattering body 609 is provided on the rear surface of the substrate 601. Since FIG. 6B shows the structure in which light is reflected at the side of the pixel electrode, the light scattering body is formed on a sealing structure made of a sealing film 610 and a sealing substrate 611 on the passivation film 608.

Since the reverse stagger type TFT structure can be more easily fabricated than the planar type TFT, the number of masks can be reduced. Further, since the gate insulating film and the channel formation region can be continuously formed, there is a merit that the interface can be formed without being polluted.

The structure of this embodiment can be freely combined with any structure of the embodiment 1 and the embodiment 2 and can be put into practice.

Embodiment 4

In this embodiment, a description will be given on an example in which the present invention is applied to a passive matrix type self-light emitting device which radiates light through a substrate.

First, a transparent film is formed on a rear surface of a substrate 701. As the transparent material for forming the transparent film, organic resin such as polycarbonate, acryl resin, polyimide, polyamide or BCB (benzocyclobutene); indium oxide, tin oxide, or zinc oxide is used to form a film, or a compound film of a combination of these is used. In order to form a light scattering body so that angles of θ3 and θ4 of a light scattering body 702 becomes 60 degrees or larger, it is preferable that the thickness (H) of the transparent film is made to have the relation of H≧W1 with respect to the pitch (W1) of the light scattering body.

Figure 7A:
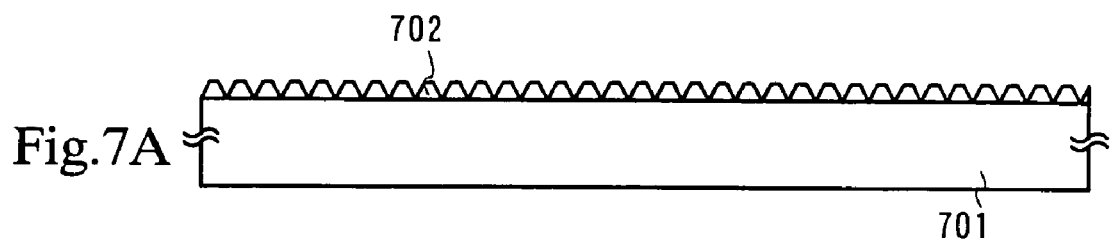
FIGS. 7A to 7C are views in which the present invention is used for a passive matrix type TFT.

By etching this transparent film, a trapezoid light scattering body 702 as shown in FIG. 7A is formed. At the time of etching, it is necessary to prevent the transparent film from being excessively etched so that the substrate 701 is exposed on the surface. This is because if the substrate is exposed on the surface, refraction of light by the light scattering body 702 comes not to be sufficiently made.

Figure 7B:
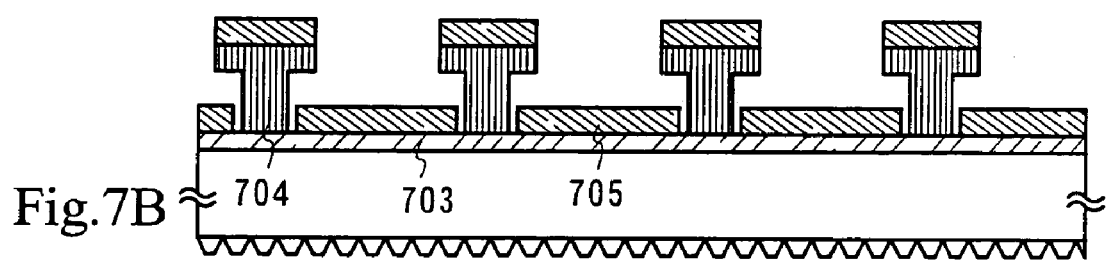

Next, the substrate 701 shown in FIG. 7A is turned upside down, and the surface of the substrate 701 is made the upside. After an insulating film is formed on the surface of the substrate 701, an anode 703 is formed on the insulating film. In this embodiment, as the anode 703, an oxide conductive film made of a compound of indium oxide and tin oxide is used (FIG. 7B).

This anode 703 is formed like a band in the parallel direction with the paper surface, and it is arranged like a stripe in the normal direction to the paper surface. This structure is same as a well-known passive matrix type self-light emitting device.

Next, a partition wall 704 is formed to intersect the anode 703 at right angles. The partition wall 704 is provided to separate a metal film which becomes a cathode. In this embodiment, a two-layer resin film is used, and it is processed to form a T shape. The structure like this can be obtained by carrying out etching under the condition that an etching rate of a lower layer is faster than that of an upper layer.

Next, an EL layer 705 is formed. In this embodiment, the EL layer 705 is formed by an evaporation method. As the material of the EL layer 705, Alq$_3$ (tris-8-quinolinolato aluminum complex) of a low molecular organic material is used. Of course, chromaticity control may be performed by adding a fluorescent material to Alq$_3$.

Next, as a cathode 707, an alloy film is formed to a thickness of 300 nm by evaporating both aluminum and lithium. At this time, the cathode 707 is separated along the partition wall 704, is formed like a band in the normal direction to the paper surface, and is arranged like a stripe. Further, as a passivation film 708, a resin film is formed thereon by an ink jet method or a printing method. It is also effective to laminate a carbon film, specifically a DLC (Diamond-Like Carbon) film thereon.

Figure 7C:
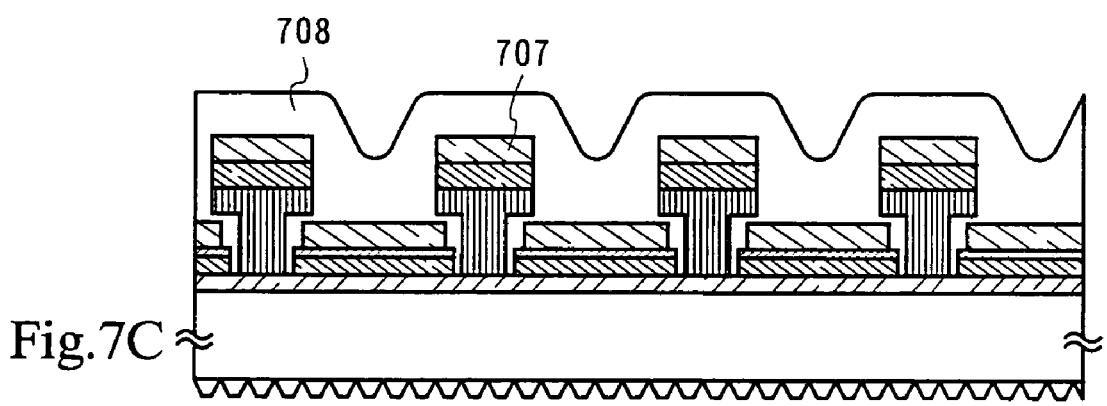

With the manner as described above, the self-light emitting device with the structure shown in FIG. 7C is completed. Thereafter, an EL element is sealed with resin so that the EL element does not come in contact with the outer air.

In the thus obtained self-light emitting device, since the light scattering body is provided on the outgoing surface of light as compared with a normal sealing structure, high extracting efficiency of light can be obtained as compared with a conventional self-light emitting device. Accordingly, since a voltage for driving an EL element can be made lower than a normal voltage, the life of the EL element can be lengthened.

The structure of this embodiment can be combined with any structure of the embodiments 1 to 3 and can be put into practice.

Embodiment 5

Figure 8A:
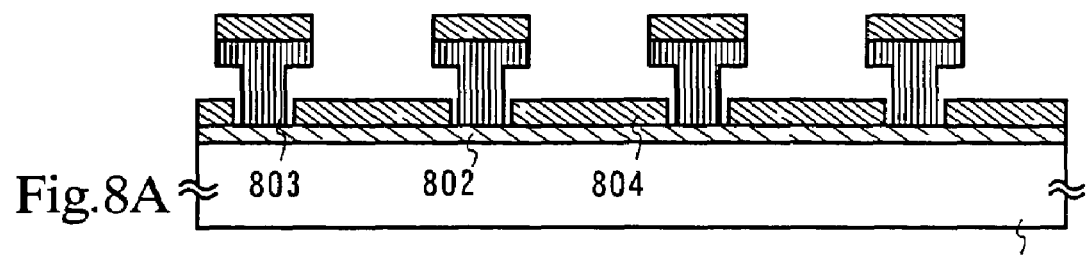
FIGS. 8A to 8C are views in which the present invention is used for a passive matrix type TFT.

In this embodiment, a description will be given on an example in which the present invention is applied to a passive matrix type self-light emitting device which radiates light upward with respect to a substrate. First, a cathode 802 is formed on a substrate 801 on which an insulating film is formed. In this embodiment, as the cathode 802, an electrode with a structure in which a MgAg film (metal film obtained by evaporating both magnesium and silver) is laminated on an aluminum film is used (FIG. 8A).

This cathode 802 is formed into a band shape in the parallel direction to the paper surface, and it is arranged in a stripe shape in the normal direction to the paper surface.

Next, a partition wall 803 is formed to intersect the cathode 802 at right angles. The partition wall 803 is provided to separate an oxide conductive film which becomes an anode. In this embodiment, a two-layer resin film is used and is processed to form a T shape. The structure like this can be obtained by carrying out etching under the condition that an etching rate of a lower layer is faster than that of an upper layer.

Next, an EL layer 804 is formed. In this embodiment, the EL layer 804 is formed by an evaporation method. As the material of the EL layer 804, Alq$_3$ (aluminum quinolinolato complex) of a low molecular material is used. Of course, chromaticity control may be performed by adding a fluorescent material to Alq$_3$.

Next, as an anode 806, an oxide conductive film made of a compound of indium oxide and zinc oxide is formed to a thickness of 300 nm. At this time, the anode 806 is separated along the partition wall 803, is formed like a band in the normal direction of the paper surface, and is arranged like a stripe. Further, as a passivation film 807, a resin film is formed thereon by an ink jet method or a printing method. It is also effective to laminate a carbon film, specifically a DLC (Diamond-Like Carbon) film thereon.

Figure 8B:
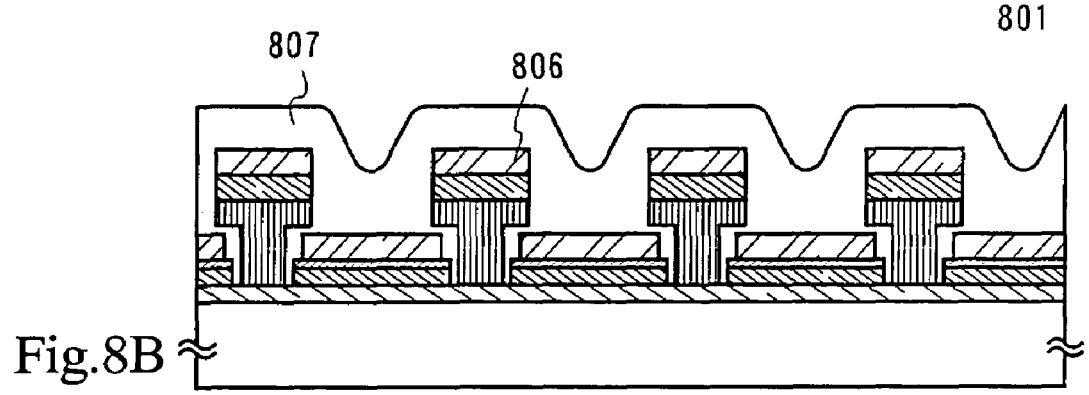

With the manner as described above, the structure shown in FIG. 8B is formed, and then, an EL element is sealed with resin so that the EL element does not come in contact with the outer air, and a sealing film 808 is formed. Further, a sealing substrate 809 is provided on the sealing film 808.

Figure 8C:
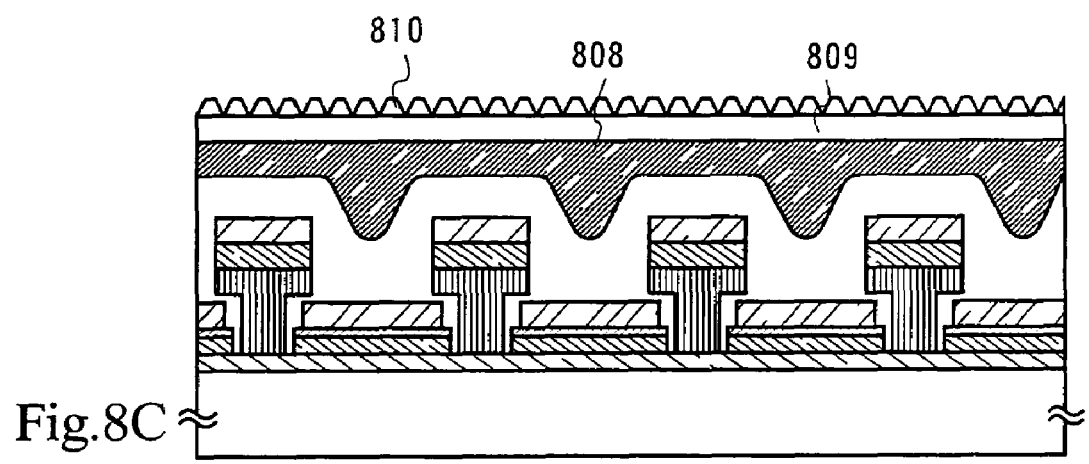

Next, a transparent film is formed on the sealing substrate 809. As the material for forming the transparent film, organic resin such as polycarbonate, acryl resin, polyimide, polyamide or BCB (benzocyclobutene), indium oxide, tin oxide, or zinc oxide is used to form a film, or a compound film of a combination of these is used. In order to form the light scattering body so that the angles of θ3 and θ4 of the light scattering body 810 become 60 degrees or larger, it is preferable that the thickness (H) of the transparent film is made to have the relation of H≧W1 with respect to the pitch (W1) of the light scattering body. By etching this transparent film, a light scattering body 810 shown in FIG. 8C is formed.

As described above, by forming the light scattering body 810 with the minute structure on the surface where light goes out, it becomes possible to extract light produced from the EL element more effectively.

It is not always necessary to provide the sealing film formed of the organic resin film as shown in this embodiment, and the EL element may be sealed in an airtight space. Incidentally, since it becomes hard for light to be extract when it goes out from a medium with a high refractive index into a medium with a low refractive index, in this case, the light scattering body is provided on an interface between the passivation film 807 and the airtight space, that is, on the passivation film 807, and the sealing substrate 809 is provided over the airtight space.

In the thus obtained self-light emitting device, since the light scattering body is provided on the surface where light goes out as compared with a normal sealing structure, the extracting efficiency of light can be raised as compared with a conventional self-light emitting device. Accordingly, since a voltage for driving the EL element can be made lower than that in a normal case, the life of the EL element can be lengthened.

The structure of this embodiment can be combined with any structure of the embodiments 1 to 4 and can be put into practice.

Embodiment 6

Figure 9A:
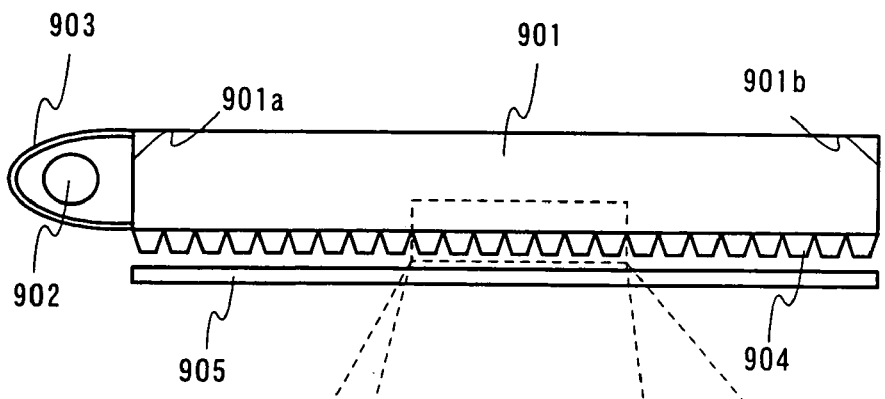
FIGS. 9A to 9C are views in which the present invention is used for a front light.
Figure 9B:
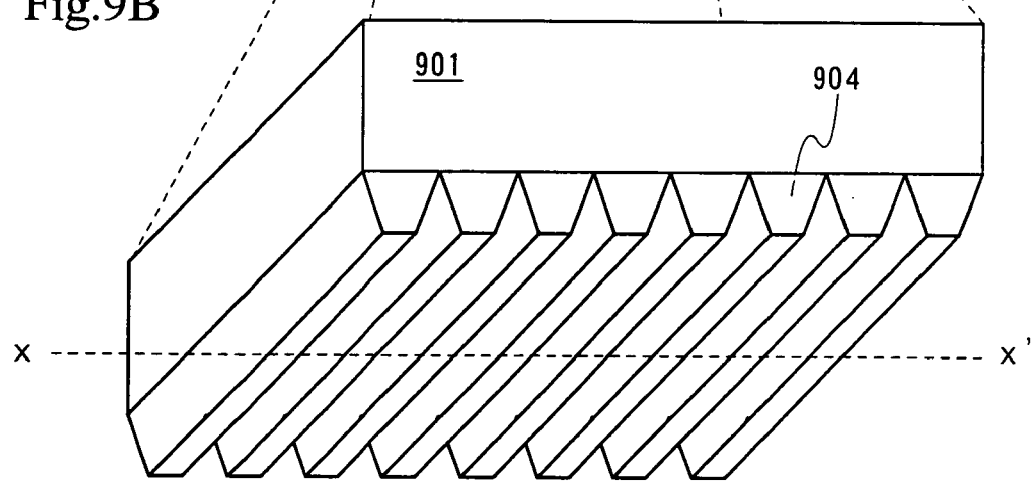
Figure 9C:
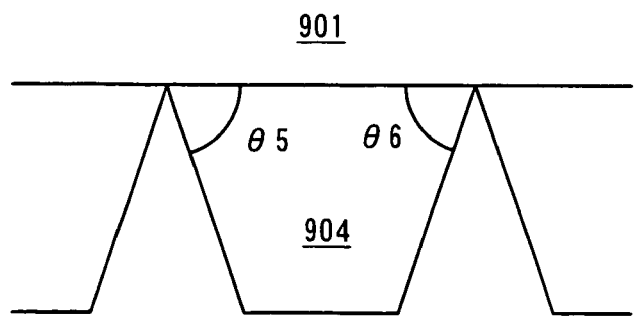

Next, an example in which the present invention is used for a front light will be described. FIGS. 9A to 9C are views showing the structure of a front light. FIGS. 9A and 9B show sections of the front light, and FIG. 9C is a perspective view of a rear surface of a light-guide plate 901.

As shown in FIG. 9A, a light source 902 is disposed at a side surface 901a of a light-guide plate 901, and a reflector 903 is provided at the back of the light source 902. A light scattering body 904 is provided to be in contact with a lower surface of the light-guide plate 901.

The light-guide plate 901 is a flat plate made of transparent material in which a short side is much shorter than a long side among four side surfaces. As the material of the light-guide plate 901 has a transmissivity (total light transmissivity) of 80%, preferably 85% or more, to visible light and the refractive index is larger than 2½, light of an incident angle of 90 degrees to the light-guide plate 901 can be refracted at the side surface 901a and can be guided to the inside of the light-guide plate 901. In this embodiment, a material with the refractive index within the range of 1.4 to 1.7 is used.

As such transparent materials, a material such as quartz, glass, or plastic can be used. As the plastic, a material such as methacrylate resin, polycarbonate, polyarylate, AS resin (acrylotrile, styrene polymer), or MS resin (methyl methacrylate, styrene polymer) can be used as a single substance or a mixture.

As the light source 902, a cold cathode tube or an LED is used, and is disposed along the side 901a of the light-guide plate 901. Two light sources may be provided along a side surface 902b.

Next, the light scattering body 904 is formed by etching after a transparent film is formed on the light-guide plate 901.

As the material for forming the transparent film, organic resin such as polycarbonate, acryl resin, polyimide, polyamide or BCB (benzocyclobutene); indium oxide, tin oxide, or zinc oxide is used to form a film, or a compound film of a combination of these is used. It is preferable that the thickness (H) of the film is made to have the relation of H≧2 W1 with respect to the pitch (W1) of the light scattering body.

When the front light formed in the manner as described above is provided between a liquid crystal panel (LCD) 905 and a user, a liquid crystal display with high extracting efficiency of light can be obtained.

In this embodiment, since the liquid crystal panel is irradiated after light is reflected by the side surface of the light scattering body, an incident angle to the liquid crystal panel can be made small. As a result, since the component of light which vertically illuminates the pixel electrode of the liquid crystal panel becomes large, the light can be effectively used.

Incidentally, FIG. 9C is a view showing a trapezoid section obtained when the light scattering body 904 is cut in the direction of x-x'. When acute angles of the trapezoid light scattering body 904 are made $\theta_5$ and $\theta_6$, it is desirable that these angles are large. If $\theta_5$ and $\theta_6$ are made large, it is possible to facilitate collection of outgoing light in the direction from the front light to the liquid crystal panel.

Incidentally, it is not necessary that the angels $\theta_5$ and $\theta_6$ are made the same angle, but may be different from each other.

Figure 11A:
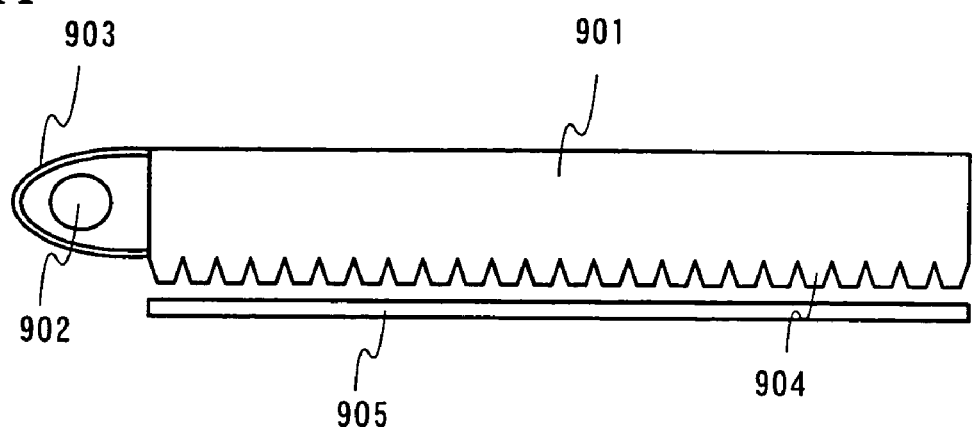
FIGS. 11A and 11B are views in which the present invention is used for a front light and a back light.

Besides, in this embodiment, the transparent film is newly formed on the light-guide plate 901, and the light scattering body 904 is formed by etching the newly formed transparent film. However, a structure as shown in FIG. 11A may be formed by directly etching the surface (at the side of the liquid crystal panel) of the light-guide plate 901.

Embodiment 7

Figure 10A:
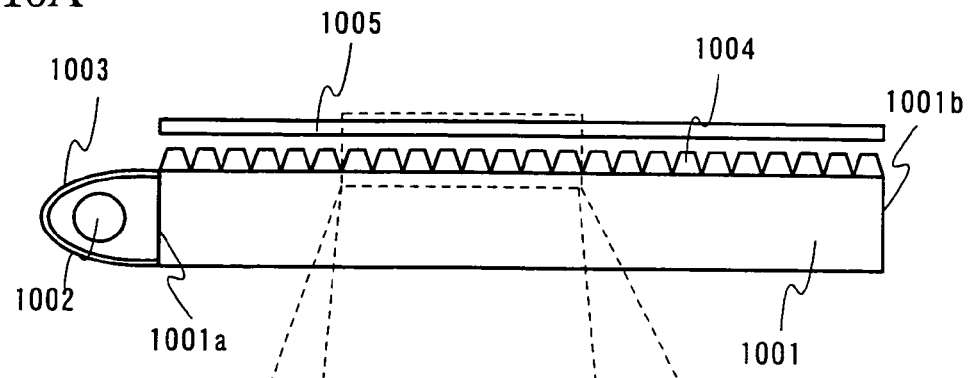
FIGS. 10A to 10C are views in which the present invention is used for a back light.
Figure 10B:
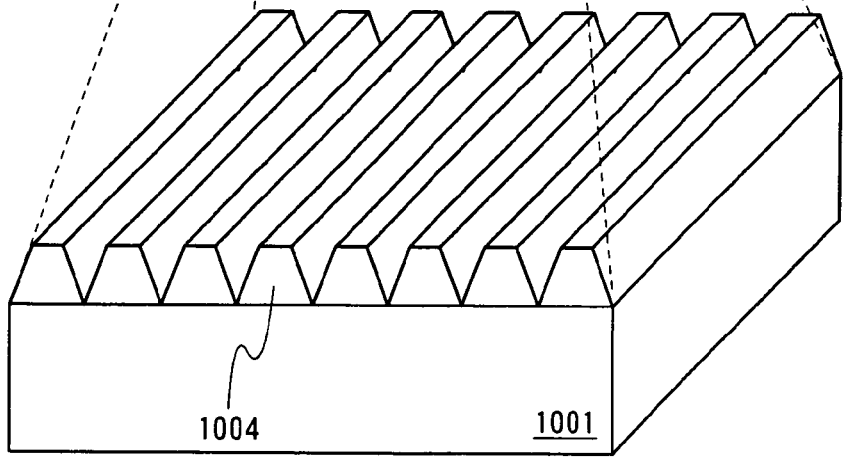
Figure 10C:
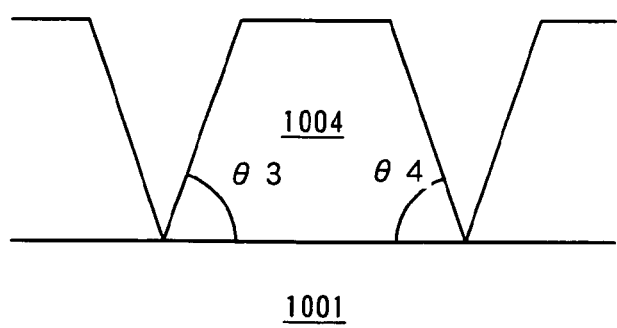

Next, an example in which the present invention is used for a back light will be described. FIGS. 10A to 10C are views showing the structure of a back light. FIG. 10A shows a section of the back light, and FIG. 10B is a perspective view of the back light.

As shown in FIG. 10A, a light source 1002 is disposed at a side surface 1001a of a light-guide plate 1001, and a reflector 1003 is provided at the back of the light source 1002. A light scattering body 1004 is provided to be in contact with an upper surface of the light-guide plate 1001.

Thus, after light emitted from the light source 1002 passes through the light scattering body 1004 from the light-guide plate 1001, the light irradiates a liquid crystal panel (LCD) 1005.

As the light source 1002, similarly to the case of the front light, a cold cathode tube or an LED is used, and is disposed along the side surface 1001a of the light-guide plate 1001. Two light sources may be provided so as to be opposite to each other along a side surface 1002b.

Figure 11B:
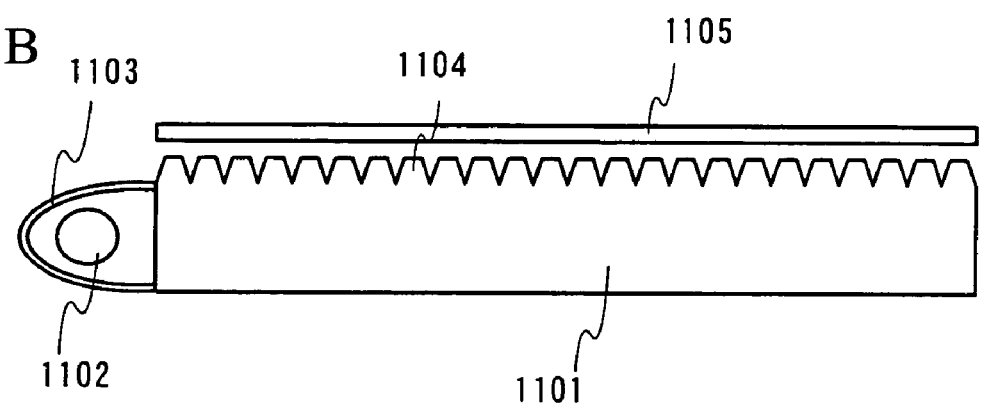

Besides, in this embodiment, after the transparent film is newly formed on the light-guide plate 1001, the light scattering body 1004 is formed by etching the transparent film. However, a structure as shown in FIG. 11B may be formed by directly etching the light-guide plate 1001 itself.

Embodiment 8

In this embodiment, a description will be given of a subject as to current-voltage characteristics of a region in which a current controlling TFT is to be driven, in a case where a self-light emitting device of the present invention is operated in digital driving.

In an EL element, if an applied voltage is changed even if the change is slight, a current flowing through the EL element is largely changed exponentially. From another point of view, even if the current flowing through the EL element is change, the value of the voltage applied to the EL element is not changed very much. The brightness of the EL element becomes high almost in proportion to the current flowing through the EL element. Thus, when the brightness of the EL element is controlled by controlling the magnitude (current value) of the current flowing through the EL element rather than by controlling the magnitude (voltage value) of the voltage applied to the EL element, the influence of characteristics of a TFT is low, and the control of brightness of the EL element is easy.

Figure 12A:
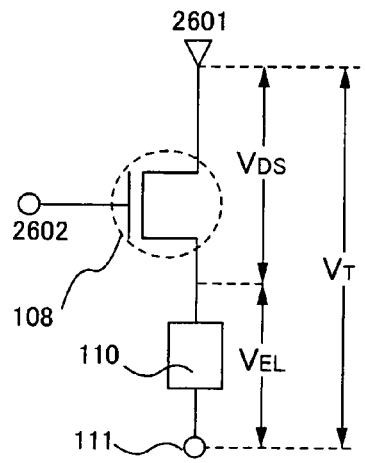
FIGS. 12A and 12B are a view showing a structure of connection of an EL element and a current controlling TFT, and a view showing current-voltage characteristics of the EL element and the current controlling TFT.
Figure 12B:
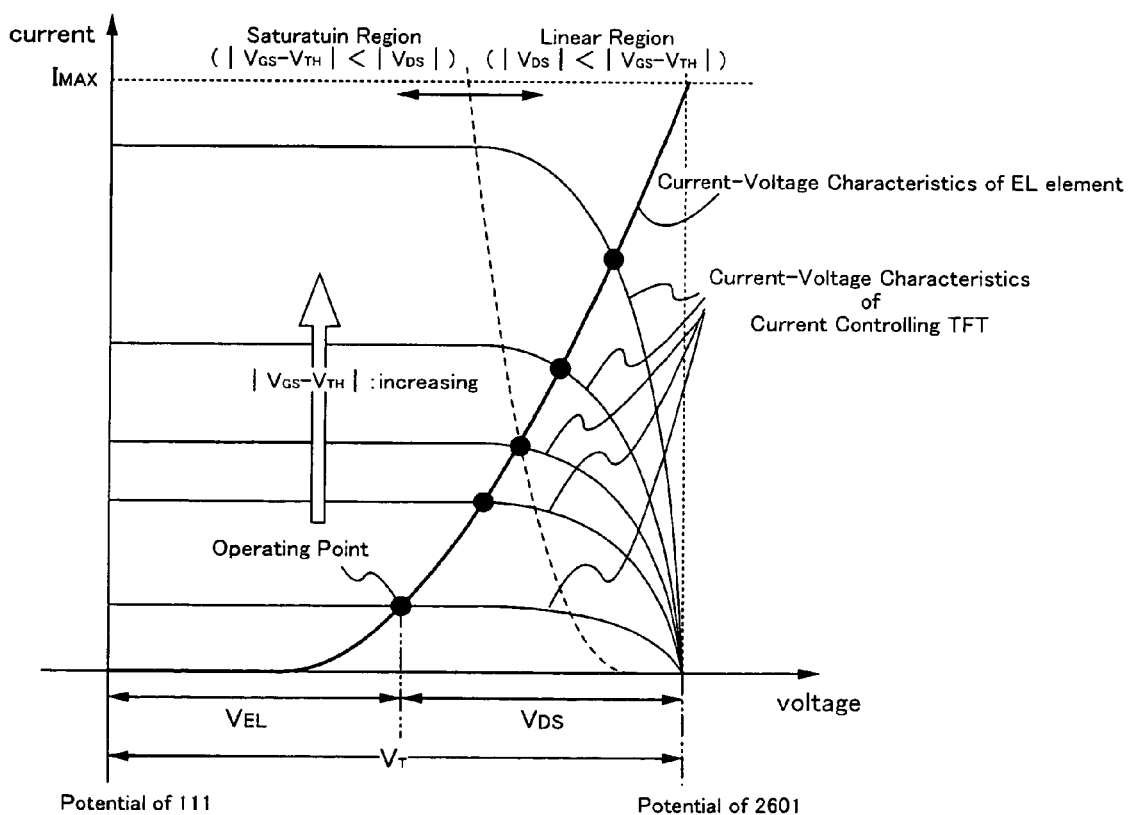

Reference will be made to FIGS. 12A and 12B. FIG. 12A shows only structural portions of a current controlling TFT 108 and an EL element 110 in a pixel of an EL display of the present invention shown in FIG. 3. FIG. 12B shows current-voltage characteristics of the current controlling TFT 108 and the EL element 110 shown in FIG. 12A. Incidentally, a graph of the current-voltage characteristics of the current controlling TFT 108 shown in FIG. 12B shows the magnitude of current flowing through the drain of the current controlling TFT 108 with respect to voltage $V_{DS}$ between the source region and the drain region, and FIG. 12B shows a plurality of graphs in which values of $V_{GS}$ of the voltage between the source region and the gate electrode of the current controlling TFT 108 are different from one another.

As shown in FIG. 12A, a voltage applied between a pixel electrode and a counter electrode 111 of the EL element 110 is made $V_{EL}$, and a voltage applied between a terminal 2601 connected to a power supply line and the counter electrode 111 of the EL element 110 is made $V_T$. The value of $V_T$ is fixed by the potential of the power supply line. Besides, a voltage between the source region and the drain region of the current controlling TFT 108 is made $V_{DS}$, and a voltage between a wiring line 2602 connected to the gate electrode of the current controlling TFT 108 and the source region, that is, a voltage between the gate electrode and the source region of the current controlling TFT 108 is made $V_{GS}$.

The current controlling TFT 108 may be either of an n-channel TFT and a p-channel TFT.

The current controlling TFT 108 and the EL element 110 are connected in series with each other. Thus, values of currents flowing through both elements (the current controlling TFT 108 and the EL element 110) are equal to each other. Accordingly, the current controlling TFT 108 and the EL element 110 shown in FIG. 12A are driven at an intersection point (operating point) of the graphs showing the current-voltage characteristics of both the elements. In FIG. 12B, $V_{EL}$ becomes a voltage between the potential of the counter electrode 111 and the potential at the operating point. The voltage $V_{DS}$ becomes a voltage between the potential at the terminal 2601 of the current controlling TFT 108 and the potential at the operating point. That is, $V_T$ is equal to the sum of $V_{EL}$ and $V_{DS}$.

Here, a case where $V_{GS}$ is changed is considered. As is understood from FIG. 12B, as $|V_{GS}-V_{TH}|$ of the current controlling TFT 108 becomes large, in other words, $|V_{GS}|$ becomes large, the value of the current flowing through the current controlling TFT 108 becomes large. Incidentally, $V_{TH}$ is a threshold voltage of the current controlling TFT 108. Thus, as is understood from FIG. 12B, when $|V_{GS}|$ becomes large, the value of the current flowing through the EL element 110 at the operating point naturally becomes large. The brightness of the EL element 110 becomes high in proportion to the value of the current flowing through the EL element 110.

When $|V_{GS}|$ becomes large so that the value of the current flowing through the EL element 110 becomes large, the value of $V_{EL}$ also becomes large in accordance with the value of the current. Since the magnitude of $V_T$ is determined by the potential of the power supply line, when $V_{EL}$ becomes large, $V_{DS}$ becomes small by that.

As shown in FIG. 12B, the current-voltage characteristics of the current controlling TFT is divided into two regions with respect to the values of $V_{GS}$ and $V_{DS}$. A region of $|V_{GS}-V_{TH}|<|V_{DS}|$ is a saturation region, and a region of $|V_{GS}-V_{TH}|>|V_{DS}|$ is a linear region.

In the saturation region, the following expression 4 is established. Incidentally, $I_{DS}$ is a value of current flowing through a channel formation region of the current controlling TFT 108. Besides, $\beta=\mu C_o W/L$, $\mu$ is a mobility of the current controlling TFT 108, $C_o$ is gate capacity per unit area, and W/L is a ratio of a channel width W to a channel length L of the channel formation region.

$$I_{DS}=\beta(V_{GS}-V_{TH})^2/2 \qquad \text{[Expression 4]}$$

In the linear region, the following expression 5 is established.

$$I_{DS}=\beta\{(V_{GS}-V_{TH})V_{DS}-V_{DS}^2/2\} \qquad \text{[Expression 5]}$$

As is understood from the expression 4, in the saturation region, the current value is hardly changed by $V_{DS}$, but the current value is determined by only $V_{GS}$.

On the other hand, as is understood from the expression 5, in the linear region, the current value is determined by $V_{DS}$ and $V_{GS}$. When $|V_{GS}|$ is made large, the current controlling TFT comes to operate in the linear region. Then, $V_{EL}$ also gradually becomes large. Thus, $V_{DS}$ becomes small by the increase of $V_{EL}$. In the linear region, when $V_{DS}$ becomes small, the amount of current also becomes small. Thus, even if $|V_{GS}|$ is made large, the current value becomes hard to increase. When $|V_{GS}|=\infty$, current value=$I_{MAX}$. That is, even if $|V_{GS}|$ is made large, current larger than $I_{MAX}$ does not flow. Here, $I_{MAX}$ is a value of current flowing through the EL element 110 when $V_{EL}=V_T$.

Like this, by controlling the magnitude of $|V_{GS}|$, the operating point can be placed in the saturation region or the linear region.

Although it is desirable that the characteristics of all current controlling TFTs are ideally identical to one another, actually, the threshold value $V_{TH}$ and the mobility $\mu$ are often different among the respective current controlling ITFs. When the threshold value $V_{TH}$ and the mobility $\mu$ of the respective current controlling TFTs are different from one another, as is understood from the expressions 4 and 5, the value of the current flowing through the channel formation region of the current controlling TFT 108 becomes different even if the value of $V_{GS}$ is the same.

Figure 13:
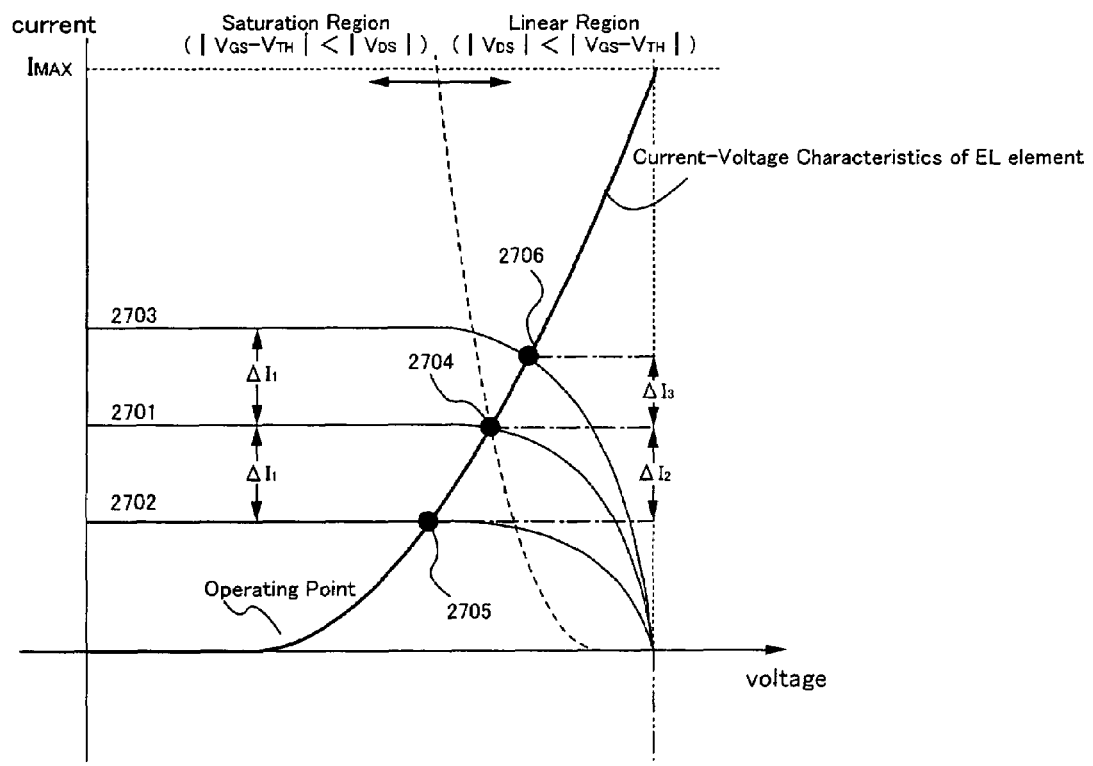
FIG. 13 is a view showing current-voltage characteristics of an EL element and a current controlling TFT.

FIG. 13 shows current-voltage characteristics of a current controlling TFT in which a threshold value $V_{TH}$ and a mobility $\mu$ deviate. A solid line 1701 is a graph of ideal current-voltage characteristics, and solid lines 2702 and 2703 respectively indicate current-voltage characteristics of the current controlling TFT in the case where the threshold value $V_{TH}$ and the mobility $\mu$ become different from ideal values. It is assumed that the graphs 2702 and 2703 of the current-voltage characteristics deviate from the graph 2701 of the current-voltage characteristics having the ideal characteristics by the same current value $\Delta I_1$ in the saturation region, an operating point 2705 of the graph 2702 of the current-voltage characteristics is in the saturation region, and an operating point 2706 of the graph 2703 of the current-voltage characteristics is in the linear region. In that case, when deviations between a current value at an operating point 2704 of the graph 2701 of the current-voltage characteristics having the ideal characteristics and current values at the operating point 2705 and the operating point 2706 are respectively made $\Delta I_2$ and $\Delta I_3$, the operating point 2706 in the linear region is smaller than the operating point 2705 in the saturation region.

Thus, in the case where the driving method of the digital system described in the present invention is used, when the current controlling TFI and the EL element are driven so that the operating point exists in the linear region, it is possible to carry out a gradation display suppressing uneven brightness of the EL element due to deviation of characteristics of the current controlling TFT.

In the case of conventional analog driving, it is preferable to drive the current controlling TFT and the EL element so that the operating point exists in the saturation region in which the current value can be controlled by only $|V_{GS}|$.

Figure 14:
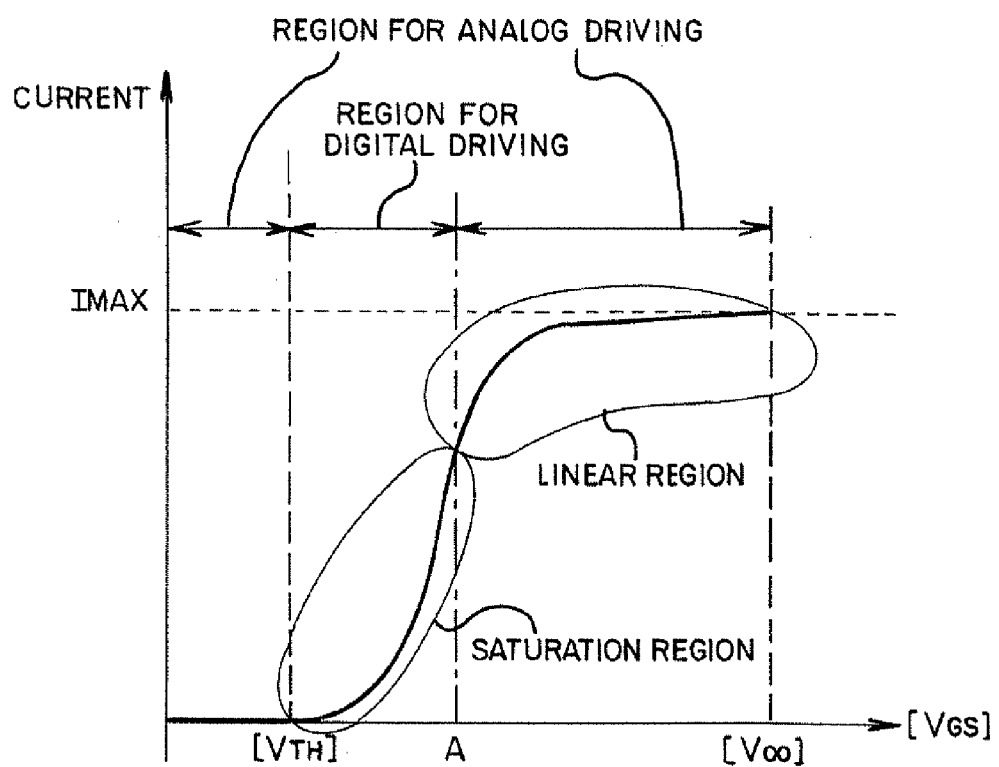
FIG. 14 is a view showing a relation between a gate voltage and a drain current of a current controlling TFT.

As a summary of the above operation analysis, FIG. 14 shows a graph of the current value with respect to the gate voltage $|V_{GS}|$ of the current controlling TFT. When the $|V_{GS}|$ is made large and becomes larger than the absolute value $|V_{TH}|$ of the threshold voltage of the current controlling TFT, the current controlling TET comes to have a conductive state, and current starts to flow. In the present specification, $|V_{GS}|$ at this time is called a lighting start voltage. When $|V_{GS}|$ is further made large, $|V_{GS}|$ becomes a value (here, it is temporarily made A) so that $|V_{GS}-V_{TH}|=|V_{DS}|$ is satisfied, and a saturation region becomes a linear region. Further, when $|V_{GS}|$ is made large, the current value becomes large and the current value becomes saturated. At that time, $|V_{GS}|=\infty$.

As is understood from FIG. 14, in the region of $|V_{GS}| \leq |V_{TH}|$, current hardly flows. The region of $|V_{TH}| \leq |V_{GS}| \leq A$ is the saturation region, and the current value is changed by $|V_{GS}|$. The region of $A \leq |V_{GS}|$ is the linear region, and the value of the current flowing through the EL element is changed by $|V_{GS}|$ and $|V_{DS}|$.

In the case where the self-light emitting device of the present invention is operated by the digital driving, it is preferable to use the region of $|V_{GS}| \leq |V_{TH}|$ and the linear region of $A \leq |V_{GS}|$. Incidentally, this embodiment can be freely combined with the self-light emitting device described in the embodiments 1 to 3.

Embodiment 9

In the case of self-emission device of the present invention, an external light emitting quantum efficiency can be remarkably improved by using an EL material by which phosphorescence from a triplet exciton can be employed for emitting a light. As a result, the power consumption of the EL element can be reduced, the lifetime of the EL element can be elongated and the weight of the EL element can be lightened.

The following is a report where the external light emitting quantum efficiency is improved by using the triplet exciton (T. Tsutsui, C. Adachi, S. Saito, Photochemical processes in Organized Molecular Systems, ed. K. Honda, (Elsevier Sci. Pub., Tokyo, 1991) p. 437).

The molecular formula of an EL material (coumarin pigment) reported by the above article is represented as follows.

(Chemical Formula 1)
(M. A. Baldo, D. F. O Brien, Y. You, A. Shoustikov, S. Sibley, M. E. Thompson, S. R. Forrest, Nature 395 (1998) p. 151)

The molecular formula of an EL material (Pt complex) reported by the above article is represented as follows.

(Chemical Formula 2)
(M. A. Baldo, S. Lamansky, P. E. Burrows, M. E. Thompson, S. R. Forrest, Appl. Phys. Lett., 75 (1999) p. 4.)
(T. Tsutsui, M.-J. Yang, M. Yahiro, K. Nakamura, T. Watanabe, T. Tsuji, Y Fukuda, T. Wakimoto, S. Mayaguchi, Jpn, Appl. Phys., 38 (12B) (1999) L1502)

The molecular formula of an EL material (Ir complex) reported by the above article is represented as follows.

(Chemical Formula 3)
As described above, if phosphorescence from a triplet exciton can be put to practical use, it can realize the external light emitting quantum efficiency three to four times as high as that in the case of using fluorescence from a singlet exciton in principle. In self-emission device shown in Embodiments 1 to 5, the structure according to this embodiment can be performed and freely implemented in combination of any structures of the present invention.

Embodiment 10

The self-emission device formed according to the present invention, is a self light emitting type, therefore compared to a liquid crystal display device, it has excellent visible properties and is broad in an angle of visibility. Accordingly, the self-emission device can be applied to a display portion in various electronic devices. For example, in order to view a TV program or the like on a large-sized screen, the self-emission device in accordance with the present invention can be used as a display portion of an EL display device (a display equipped with a self-emission device in the case) having a diagonal size of 30 inches or larger (typically 40 inches or larger).

The EL display includes all kinds of displays to be used for displaying information, such as a display for a personal computer, a display for receiving a TV broadcasting program, a display for advertisement display. Moreover, the self-emission device in accordance with the present invention can be used as a display portion of other various electric devices.

As other electronic equipments of the present invention there are: a video camera; a digital camera; a goggle type display (head mounted display); a car navigation system; a sound reproduction device (a car audio stereo, an audio set and so forth); a notebook type personal computer; a game apparatus; a portable information terminal (such as a mobile computer, a portable telephone, a portable game machine, or an electronic book); and an image playback device equipped with a recording medium (specifically, device provided with a display portion which plays back images in a recording medium such as a digital versatile disk Player (DVD), and displays the images). In particular, in the case of the portable information terminal, use of the self-emission device is preferable, since the portable information terminal that is likely to be viewed from a tilted direction is often required to have a wide viewing angle.

Further, these electronic device can be mounted the light sensor which can control the brightness corresponding to surrounding brightness to lower the electronic power consumption. It is preferable that the contrast of brightness of the self-emission device to surrounding brightness is set from 100 to 150. FIGS. 15A to 16B respectively show various specific examples of such electronic devices.

Figure 15A:
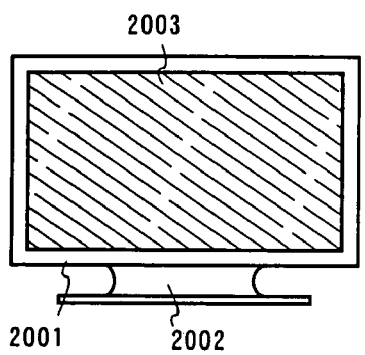
FIGS. 15A to 15F are views showing examples of electrical appliances.

FIG. 15A shows an EL display containing a casing 2001, a support stand 2002, and a display portion 2003. The present invention can be used as the display portion 2003. Such an EL display is a self-emission type so that a back light is not necessary. Thus, the display portion can be made thinner than that of a liquid crystal display.

Figure 15B:
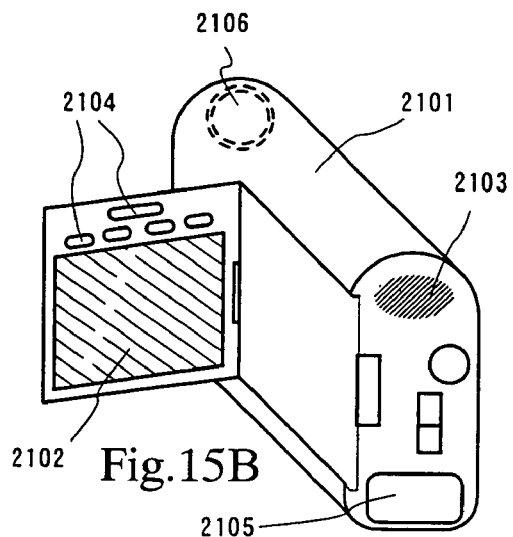

FIG. 15B shows a video camera, and contains a main body 2101, a display portion 2102, a sound input portion 2103, operation switches 2104, a battery 2105, and an image receiving portion 2106. The self-emission device of the present invention can be used as the display portion 2102.

Figure 15C:
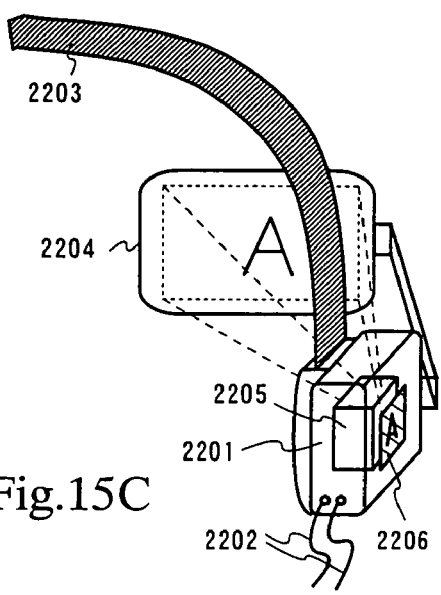

FIG. 15C shows a portion (the right-half piece) of an EL display of head mount type, which includes a main body 2201, signal cables 2202, a head mount band 2203, a display portion (a) 2204, an optical system 2205, a display portion (b) 2206, or the like. The electronic device and the driving method of the present invention is applicable to the display portion (a) 2204 or the display portion (b) 2206.

Figure 15D:
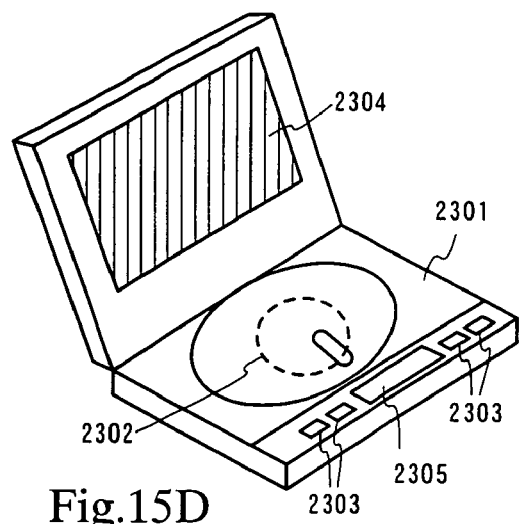

FIG. 15D shows an image playback device equipped with a recording-medium (specifically, a DVD playback device), and contains a main body 2301, a recording medium (such as a DVD) 2302, operation switches 2303, a display portion (a) 2304, and a display portion (b) 2305. The display portion (a) 2304 is mainly used for displaying image information. The display portion (b) 2305 is mainly used for displaying character information. The self-emission device of the present invention can be used as the display portion (a) 2304 and as the display portion (b) 2305. Note that the image playback device equipped with the recording medium includes devices such as image playback devices and game machines.

Figure 15E:
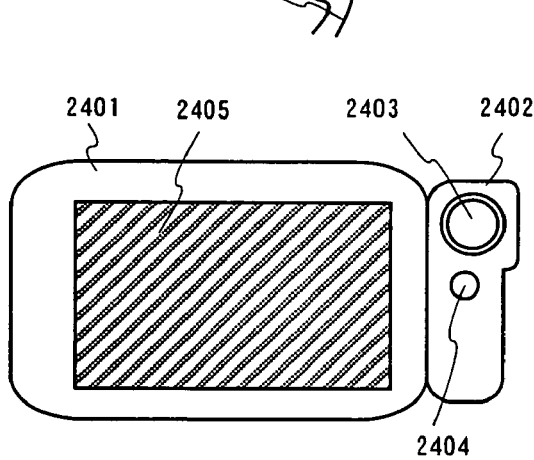

FIG. 15E shows a portable (mobile) computer, and contains a main body 2401, a camera portion 2402, an image receiving portion 2403, operation switches 2404, and a display portion 2405. The self-emission device of the present invention can be used as the display portion 2405.

Figure 15F:
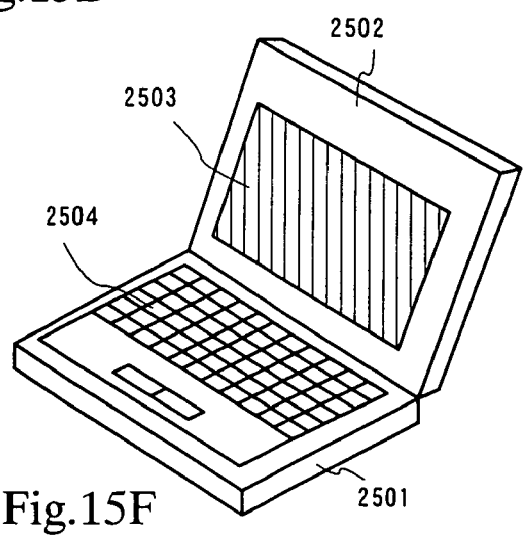

FIG. 15F is a personal computer, and contains a main body 2501, a casing 2502, a display portion 2503, and a keyboard 2504. The self-emission device of the present invention is applicable to the display portion 2503.

Note that if the luminance of organic EL materials increases in the future, then it will become possible to use the present invention in a front type or a rear type projector by expanding and projecting light containing output image information with a lens or the like.

Further, the above electric devices display often information transmitted through an electronic communication circuit such as the Internet and CATV (cable tv), and particularly situations of displaying moving images is increasing. The self-emission device is suitable for displaying moving pictures since the EL material can exhibit high response speed. However, if the contour between the pixels becomes unclear, the moving pictures as a whole cannot be clearly displayed. Since the self-emission device in accordance with the present invention can make the contour between the pixels clear, it is significantly advantageous to apply the self-emission device of the present invention to a display portion of the electronic devices.

In addition, since the self-emission device conserves power in the light emitting portion, it is preferable to display information so as to make the light emitting portion as small as possible. Consequently, when using the self-emission device in a display portion mainly for character information, such as in a portable information terminal, in particular a portable telephone or a sound reproduction device, it is preferable to drive the light emitting device so as to form character information by the light emitting portions while non-light emitting portions are set as background.

Figure 16A:
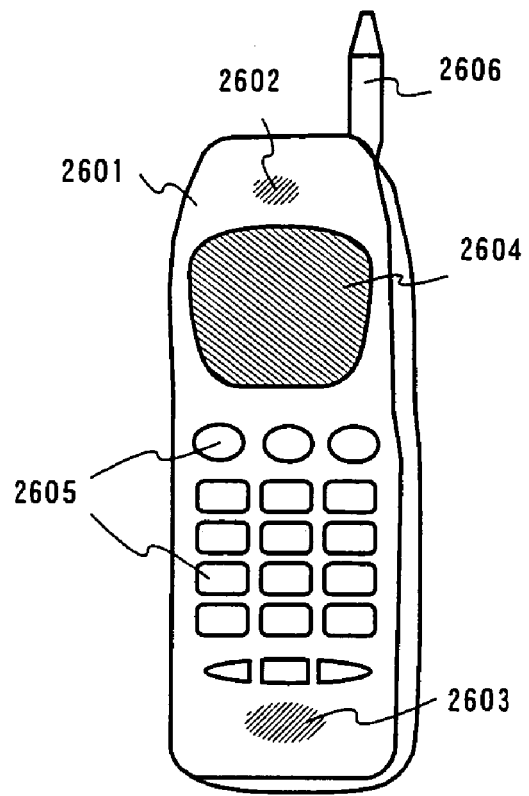
FIGS. 16A and 16B are views showing examples of electrical appliances.

FIG. 16A shows a portable telephone, and contains a main body 2601, a sound output portion 2602, a sound input portion 2603, a display portion 2604, operation switches 2605, and an antenna 2606. The self-emission device of the present invention can be used as the display portion 2604. Note that by displaying white color characters in a black color background, the display portion 2604 can suppress the power consumption of the portable telephone.

Figure 16B:
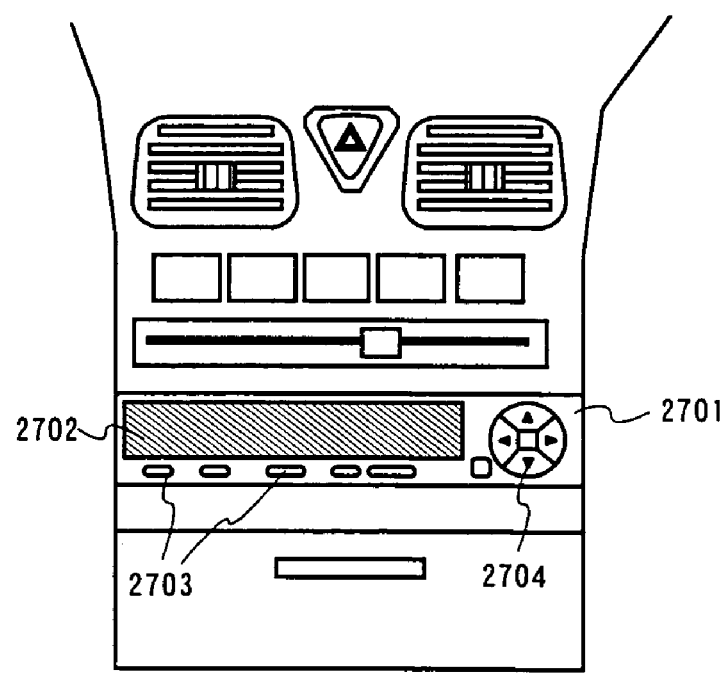

FIG. 16B shows a sound reproduction device, in a concrete term, a car mounted audio equipment and contains a main body 2701, a display portion 2702, and operation switches 2703 and 2704. The self-emission device of the present invention can be used as the display portion 2702. Further, a car mount type audio stereo is shown in this embodiment, but a fixed type audio playback device may also be used. Note that, by displaying white color characters in a black color background, the display portion 2704 can suppress the power consumption. It is effective to portable sound reproduction device.

As described above, the application range of this invention is extremely wide, and it may be used for electric devices in various fields. Further, the electric device of this embodiment may be obtained by using a self-emission device freely combining the structures of the first to eighth embodiments.

When the present invention is carried out to provide a light scattering body on an insulator, extracting efficiency of light from a light emitting element, especially in an EL element can be improved. Further, when a transparent film is etched to form the light scattering body, minute processing of pitches becomes possible. When the light scattering body of minute pitches is formed with the manner described above, the self-light emitting device with high efficiency of light emission can be provided.

Chemical Formula 1

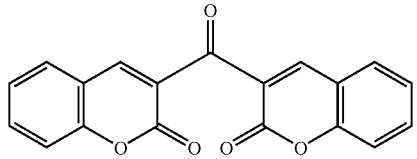

Chemical Formula 2

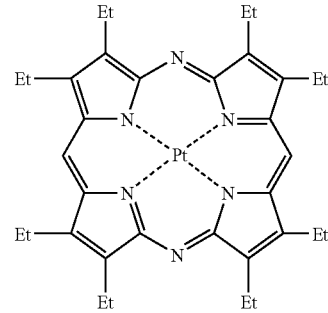

Chemical Formula 3

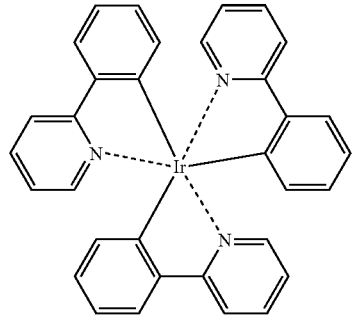

What is claimed is:

1. A light emitting display device comprising:
a substrate;
a first electrode formed over a fast surface of the substrate;
an EL layer formed over the first electrode;
a second electrode formed over the EL layer; and
a light scattering body having a first surface and a second surface, formed on a second surface of the substrate, which is opposite to the first surface of the substrate,
wherein the first surface of the light scattering body is in contact with the second surface of the substrate,
wherein the second surface of the light scattering body is for scattering and extracting a light, and
wherein an inner angle between the first surface of the light scattering body and the second surface of the light scattering body is not less than 60° and is less than 180°.

2. A light emitting device according to claim 1, wherein the first electrode is electrically connected to a thin film transistor.

3. A light emitting device according to claim 1, wherein the first electrode is an anode, and the second electrode is a cathode.

4. A light emitting device according to claim 1, wherein the first electrode comprises a transparent material, and the second electrode comprises a light shielding material.

5. A light emitting device according to claim 1, wherein the light scattering body comprises a transparent material.

6. A light emitting device according to claim 1, wherein the light scattering body comprises one selected Bum the group consisting of polycarbonate, polyimide, BCB, indium oxide, and tin oxide.

7. A light emitting device according to claim 1, wherein a thickness (H) of the light scattering body has a relation of $H \geq W1$ with respect to a pitch (W1) of the light scattering body.

8. A light emitting device according to claim 1, wherein a pixel pitch is at least twice a long as a pitch of the light scattering body.

9. A light emitting device according to claim 1, wherein the self-light emitting device is incorporated into one of selected Born the group consisting of an EL display, a video camera, and a computer.

10. A light emitting display device comprising:
a substrate;
a first electrode formed over a first surface of the substrate;
an EL layer formed over the first electrode;
a second electrode formed over the EL layer; and
a light scattering body having a first surface and a second surface, formed on a second surface of the substrate, which is opposite to the first surface of the substrate,
wherein the first surface of the light scattering body is in contact with the second surface of the substrate,
wherein the second surface of the light scattering body is for scattering and extracting a light, and
wherein an inner angle between the first surface of the light scattering body and the second surface of the light scattering body is not less than 60° and is less than 180°, and
wherein the light scattering body is made of a different material from that of the substrate.

11. A light emitting display device according to claim 10, wherein the first electrode comprises a transparent material, and the second electrode comprises a light shielding material.

12. A light emitting device according to claim 1, wherein a light emitted from the EL layer is extracted from a surface of the light scattering body into the air.

13. A light emitting device according to claim 10, wherein a light emitted from the EL layer is extracted from a surface of the light scattering body into the air.

14. A light emitting display device comprising:
a substrate having a first surface and a second surface which is opposite to the first surface;
a first electrode formed over the first surface of the substrate;
an EL layer formed over the first electrode;
a second electrode formed over the EL layer; and
a light scattering body having a first surface and a second surface, formed on the second surface of the substrate,
wherein the first surface of the light scattering body is in contact with the second surface of the substrate,
wherein the second surface of the light scattering body is for scattering and extracting a light, and
wherein an inner angle between the first surface of the light scattering body and the second surface of the light scattering body is not less than 60° and is less than 180°,
wherein the first electrode comprises a transparent material, and the second electrode comprises a light shielding material, and
wherein the light scattering body is a trapezoid.

15. A light emitting device according to claim 14, wherein a light emitted from the EL layer is extracted firm a surface of the light scattering body into the air.

16. A light emitting device according to claim 1, wherein the light scattering body is a trapezoid.

17. A light emitting device according to claim 10, wherein the light scattering body is a trapezoid.

18. A light emitting device according to claim 1, wherein the first electrode is electrically connected to a TFT.

19. A light emitting device according to claim 10, wherein the first electrode is electrically connected to a TFT.

20. A light emitting device according to claim 14, wherein the first electrode is electrically connected to a TFT.

* * * * *